US012803529B2

(12) United States Patent
Loizou et al.

(10) Patent No.: US 12,803,529 B2
(45) Date of Patent: Nov. 17, 2026

(54) ACOUSTIC FILTER WITH LAMINATE BASED AND BOND- WIRE BASED INDUCTANCE

(71) Applicant: Qorvo US, Inc., Greensboro, NC (US)

(72) Inventors: Loizos Loizou, Grasbrunn (DE); Achim Demal, Munich (DE)

(73) Assignee: Qorvo US, Inc., Greensboro, NC (US)

( * ) Notice: Subject to any disclaimer, the term of this patent is extended or adjusted under 35 U.S.C. 154(b) by 74 days.

(21) Appl. No.: 18/928,926

(22) Filed: Oct. 28, 2024

(65) Prior Publication Data

US 2025/0141429 A1 May 1, 2025

Related U.S. Application Data

(60) Provisional application No. 63/594,166, filed on Oct. 30, 2023.

(51) Int. Cl.
*H03H 9/54* (2006.01)
*H03H 9/02* (2006.01)
(Continued)

(52) U.S. Cl.
CPC ........ *H03H 9/542* (2013.01); *H03H 9/02086* (2013.01); *H03H 9/02913* (2013.01);
(Continued)

(58) Field of Classification Search
CPC ............... H03H 9/542; H03H 9/02086; H03H 9/02913; H03H 9/0523; H03H 9/059;
(Continued)

(56) References Cited

U.S. PATENT DOCUMENTS 4,409,567 A * 10/1983 Setsune .............. H03H 9/02874 333/194
5,999,069 A * 12/1999 Ushiroku ............. H03H 9/6483 333/195
(Continued)

FOREIGN PATENT DOCUMENTS

CN 101795118 A * 8/2010 ............... H03H 7/42
CN 109861665 A * 6/2019 ........... H03H 9/0533
EP 0367181 A2 * 5/1990 ........... H03H 9/0585

OTHER PUBLICATIONS

Ahn, Y. et al., "A 50-MHz Fully Integrated Low-Swing Buck Converter Using Packaging Inductors," IEEE Transactions on Power Electronics, vol. 27, No. 10, Oct. 2012, IEEE, pp. 4347-4356.
(Continued)

*Primary Examiner* — Andrea Lindgren Baltzell
*Assistant Examiner* — Kimberly E Glenn
(74) *Attorney, Agent, or Firm* — Withrow & Terranova, P.L.L.C.

(57) ABSTRACT

The present disclosure relates to an acoustic filter including a laminate with a first metal layer, an acoustic device die with a number of resonators, and a bond-wire (BW). The first metal layer on a top surface of the laminate includes at least a connection trace. The acoustic device die and the BW reside over the top surface of the laminate. A specific one of the resonators is electrically coupled to a first end of the connection trace, and the BW is in contact with a second end of the connection trace. Herein, the BW is not in contact with the acoustic device die. At least the BW and the connection trace of the laminate form an inductor electrically connected to the specific resonator in the acoustic device die.

21 Claims, 16 Drawing Sheets

(51) Int. Cl.

| | |
|---|---|
| ***H03H 9/05*** | (2006.01) |
| ***H03H 9/10*** | (2006.01) |
| ***H03H 9/56*** | (2006.01) |
| ***H03H 9/64*** | (2006.01) |

(52) U.S. Cl.
CPC .......... *H03H 9/0523* (2013.01); *H03H 9/059* (2013.01); *H03H 9/1007* (2013.01); *H03H 9/1085* (2013.01); *H03H 9/568* (2013.01); *H03H 9/6483* (2013.01)

(58) Field of Classification Search
CPC .... H03H 9/1007; H03H 9/1085; H03H 9/568; H03H 9/6483; H03H 9/0542; H03H 9/0557; H03H 9/706
See application file for complete search history.

(56) References Cited

U.S. PATENT DOCUMENTS

| | | | |
|---|---|---|---|
| RE37,639 | E | 4/2002 | Ehara et al. |
| 10,749,499 | B2 * | 8/2020 | Liu .......................... H01Q 1/50 |
| 2008/0217708 | A1 | 9/2008 | Reisner et al. |
| 2013/0043961 | A1 | 2/2013 | Gebauer et al. |
| 2013/0109332 | A1 | 5/2013 | Aigner |
| 2023/0030644 | A1 | 2/2023 | Yu et al. |

OTHER PUBLICATIONS

Hirmer, K. et al., "3D Field Simulation Model for Bond Wire On-Chip Inductors Validated by Measurements," 2019 Kleinheubach Conference, Sep. 23-25, 2019, Miltenberg, Germany, IEEE, 4 pages.

Kulkarni, S. et al., "PCB Embedded Bondwire Inductors With Discrete Thin-Film Magnetic Core for Power Supply in Package," IEEE Journal of Emerging and Selected Topics in Power Electronics, vol. 6, No. 2, Jun. 2018, IEEE, pp. 614-620.

Lee, H.-Y., "Wideband Characterization of a Typical Bonding Wire for Microwave Millimeter-wave Integrated Circuits," IEEE Transactions on Microwave Theory and Techniques, vol. 43, No. 1, Jan. 1995, IEEE, pp. 63-68.

Lee, W. et al., "A Frequency Tunable Resonant Clock Distribution Scheme Using Bond-Wire Inductor," 2008 Electrical Design of Advanced Packaging and Systems Symposium, Dec. 10-12, 2008, Seoul, South Korea, IEEE, pp. 24-26.

Ndip, I. et al., "Modeling and Minimizing the Inductance of Bond Wire Interconnects," 2013 17th IEEE Workshop on Signal and Power Integrity, May 12-15, 2013, Paris, France, IEEE, 4 pages.

* cited by examiner

ACOUSTIC FILTER WITH LAMINATE BASED AND BOND- WIRE BASED INDUCTANCE

RELATED APPLICATIONS

This application claims the benefit of provisional patent application Ser. No. 63/594,166, filed Oct. 30, 2023, the disclosure of which is hereby incorporated herein by reference in its entirety.

FIELD OF THE DISCLOSURE

The present disclosure relates to an acoustic filter with an acoustic device die and one or more inductors implemented by at least a metallic portion of a laminate and one or more bond-wires that are connected to the metallic portion of the laminate and not in contact with the acoustic device die.

BACKGROUND

Due to small sizes, high Q values, and very low insertion losses at microwave frequencies, particularly those above 1.5 Gigahertz (GHz), acoustic filters, such as Bulk Acoustic Wave (BAW) filters and Surface Acoustic Wave (SAW) filters, have been widely used in many modern wireless applications. For instance, the BAW filters are the filter of choice for many 3rd Generation (3G) and 4th Generation (4G) wireless devices, and are destined to dominate filter applications for 5th Generation (5G) wireless devices.

A typical acoustic filter includes an acoustic device die that is composed of multiple acoustic resonators (e.g., BAW resonators or SAW resonators). In order to achieve enhanced performance of the acoustic filter, like enhanced bandwidth of the acoustic filter and/or an enhanced out-of-band rejection level, one or more inductors are introduced to the acoustic filter and electrically connected to certain acoustic resonators of the acoustic device die.

Conventionally, these inductors are formed by metal layers embedded in a laminate, on which the acoustic device die is mounted (i.e., the inductors are formed underneath the acoustic device die). To avoid signal interference, within the laminate, the metal layers used to form the inductors are desired to be separate from other metal layers used for signal transmission. Therefore, a total number of the metal layers within the laminate is relatively large. In addition, once there are multiple inductors needed for the acoustic filter, a great volume of the laminate is required. As such, the size of the final filter solution will significantly increase.

Accordingly, there remains a need for improved acoustic filter designs, which are capable of utilizing inductors to enhance filtering performances without using a large amount of laminate real estate or a large number of metal layers in the laminate. Furthermore, there is also a need for cost efficiency.

SUMMARY

The present disclosure relates to an acoustic filter with an acoustic device die and one or more inductors implemented by at least a metallic portion of a laminate and one or more bond-wires that are connected to the metallic portion of the laminate and not in contact with the acoustic device die. The disclosed acoustic filter includes a laminate with a first metal layer, an acoustic device die with a number of resonators, and a bond-wire (BW). The first metal layer on a top surface of the laminate includes at least a connection trace. The acoustic device die and the BW reside over the top surface of the laminate. A specific one of the resonators is electrically coupled to a first end of the connection trace, and the BW is in contact with a second end of the connection trace. Herein, the BW is not in contact with the acoustic device die. At least the BW and the connection trace of the laminate form an inductor electrically connected to the specific resonator in the acoustic device die.

In one embodiment of the acoustic filter, the first metal layer further includes an extra connection trace, which is separate from the connection trace. The BW includes a first vertical section, a second vertical section, and a horizontal section. A bottom end of the first vertical section is in contact with the second end of the connection trace, a bottom end of the second vertical section is directly attached to the extra connection trace, and a top end of the first vertical section and a top end of the second vertical section are connected by the horizontal section. The inductor electrically connected to the first resonator is formed at least by a combination of the BW, the connection trace, and the extra connection trace.

According to one embodiment, the acoustic filter further includes a mold compound and a shielding structure. Herein, the mold compound resides over the top surface of the laminate and fully encapsulates the acoustic device die and the BW. The shielding structure covers at least a top surface of the mold compound and is coupled to ground. The extra connection trace is electrically connected to ground, an input port, a second electrode of the first resonator, or a second resonator included in the resonators.

According to one embodiment, the acoustic filter further includes a mold compound, a shielding structure, and an isolated shielding strip. Herein, the mold compound resides over the top surface of the laminate and fully encapsulates the acoustic device die. The shielding structure is formed at least over a top surface of the mold compound and is coupled to ground. The isolated shielding strip is formed over the top surface of the mold compound and is separated from the shielding structure by a gap, where the shielding structure and the isolated shielding strip are formed from a same set of metal layers. The BW includes a first vertical section and a second vertical section, which extend vertically through the mold compound and are connected to two ends of the isolated shielding strip, respectively. At least the BW, the isolated shielding strip, and the connection trace form the inductor that is electrically connected to the first resonator in the acoustic device die.

In one embodiment of the acoustic filter, the first metal layer further includes an extra connection trace, which is separate from the connection trace. A bottom end of the first vertical section is in contact with the second end of the connection trace, a bottom end of the second vertical section is directly attached to the extra connection trace, and a top end of the first vertical section and a top end of the second vertical section are connected by the isolated shielding strip. A combination of the BW and the isolated shielding strip is configured to connect the connection trace to the extra connection trace, and the inductor electrically connected to the first resonator is formed at least by a combination of the connection trace, the BW, the isolated shielding strip, and the extra connection trace. The extra connection trace is electrically connected to ground, an input port, a second electrode of the first resonator, or a second resonator included in the resonators.

In one embodiment of the acoustic filter, the laminate further includes a second metal layer different from the first metal layer, and the second metal layer at least includes a second connection trace. The first electrode of the first resonator is electrically coupled to the connection trace of the first metal layer through the second connection trace of the second metal layer. The inductor electrically connected to the first resonator in the acoustic device die is formed at least by a combination of the BW, the connection trace, and the second connection trace in the laminate.

According to one embodiment, the acoustic filter further includes a mold compound, and a shielding structure. Herein, the mold compound resides over the top surface of the laminate and fully encapsulates the acoustic device die. The shielding structure covers at least a top surface of the mold compound and is coupled to ground. The BW is a vertical element, which extends vertically through the mold compound and is in contact with the shielding structure.

According to one embodiment, the acoustic filter further includes a secondary BW formed over the top surface of the laminate. Herein, the laminate includes a number of metal layers, where the first metal layer is included in these metal layers. At least one of the metal layers includes an auxiliary connection trace, which is separate from the connection trace of the first metal layer. The BW is configured to connect the second end of the connection trace to a first end of the auxiliary connection trace. The secondary BW is connected to a second end of the auxiliary connection trace and in series with the first BW, such that the inductor electrically connected to the first resonator is formed at least by a combination of the connection trace, the BW, the auxiliary connection trace, and the secondary BW.

In one embodiment of the acoustic filter, the first metal layer further includes an extra connection trace, which is separate from the connection trace and the auxiliary connection trace. The secondary BW is configured to connect the auxiliary connection trace to the extra connection trace, such that the inductor electrically connected to the first resonator is formed at least by a combination of the connection trace, the BW, the auxiliary connection trace, the secondary BW, and the extra connection trace. The extra connection trace is electrically connected to ground, an input port, a second electrode of the first resonator, or a second resonator included in the resonators.

According to one embodiment, the acoustic filter further includes a surface mounted device (SMD) inductor formed over the top surface of the laminate. Herein, the laminate includes a number of metal layers, where the first metal layer is included in these metal layers. At least one of the metal layers includes an auxiliary connection trace, which is separate from the connection trace of the first metal layer. The BW is configured to connect the second end of the connection trace to a first end of the auxiliary connection trace. The SMD inductor is connected to a second end of the auxiliary connection trace and in series with the first BW, such that the inductor electrically connected to the first resonator is formed at least by a combination of the connection trace, the BW, the auxiliary connection trace, and the SMD inductor.

According to one embodiment, the acoustic filter further includes a mold compound, a shielding structure, and an isolated shielding strip. Herein, the mold compound resides over the top surface of the laminate and fully encapsulates the acoustic device die and the SMD inductor. The shielding structure is formed at least over a top surface of the mold compound and is coupled to ground. The isolated shielding strip is formed over the top surface of the mold compound and is separated from the shielding structure by a gap, where the shielding structure and the isolated shielding strip are formed from a same set of metal layers. The BW includes a first vertical section and a second vertical section, which extend vertically through the mold compound and are connected to two ends of the isolated shielding strip, respectively. At least the connection trace of the first metal layer, the BW, the isolated shielding strip, the auxiliary connection trace, and the SMD inductor form the inductor that is electrically connected to the first resonator in the acoustic device die.

In one embodiment of the acoustic filter, the BW has one of a Pi-shaped structure, an inverted U-shaped structure, and an inverted V-Shaped structure.

In one embodiment of the acoustic filter, the first metal layer further includes a ground portion, which is separate from the connection trace and is coupled to ground. The BW is in contact with the ground portion and configured to connect the second end of the connection trace to the ground portion, such that the first resonator is coupled to ground through the inductor at least formed by the combination of the BW and the connection trace in the laminate.

In one embodiment of the acoustic filter, the first metal layer further includes an extra connection trace, which is separate from the connection trace and electrically coupled to a second electrode of the first resonator. The BW is connected directly and in series between the connection trace and the extra connection trace, such that the particular resonator is parallel to the inductor formed by a combination of the BW, the connection trace, and the extra connection trace.

In one embodiment of the acoustic filter, the first metal layer further includes an extra connection trace, which is separate from the connection trace and is coupled to an input port. The BW is in contact with the extra connection trace and configured to connect the second end of the connection trace to the extra connection trace, such that the first resonator is coupled to the input port through the inductor formed by a combination of the BW, the connection trace, and the extra connection trace.

In one embodiment of the acoustic filter, the resonators further include a second resonator. The first metal layer further includes an extra connection trace, which is separate from the connection trace. The second resonator is electrically coupled to a first end of the extra connection trace. The BW is connected directly and in series between a second end of the extra connection trace and the second end of the connection trace, such that the inductor, which is formed by a combination of the BW, the connection trace, and the extra connection trace, is electrically coupled between the first resonator and the second resonator.

According to one embodiment, a system includes radio-frequency (RF) input circuitry, RF output circuitry, and filter circuitry that has at least one acoustic filter connected between the RF input circuitry and the RF output circuitry. Herein, the at least one acoustic filter includes a laminate with a first metal layer, an acoustic device die with a number of resonators, and a BW. The first metal layer on a top surface of the laminate includes at least a connection trace. The acoustic device die and the BW reside over the top surface of the laminate. A specific one of the resonators is electrically coupled to a first end of the connection trace, and the BW is in contact with a second end of the connection trace. Herein, the BW is not in contact with the acoustic device die. At least the BW and the connection trace of the laminate form an inductor electrically connected to the specific resonator in the acoustic device die.

According to one embodiment, a user element includes a baseband processor, receive circuitry, and transmit circuitry. Herein, at least one of the baseband processor, the transmit circuitry, and the receive circuitry includes an acoustic filter that has a laminate with a first metal layer, an acoustic device die with a number of resonators, and a BW. The first metal layer on a top surface of the laminate includes at least a connection trace. The acoustic device die and the BW reside over the top surface of the laminate. A specific one of the resonators is electrically coupled to a first end of the connection trace, and the BW is in contact with a second end of the connection trace. Herein, the BW is not in contact with the acoustic device die. At least the BW and the connection trace of the laminate form an inductor electrically connected to the specific resonator in the acoustic device die.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
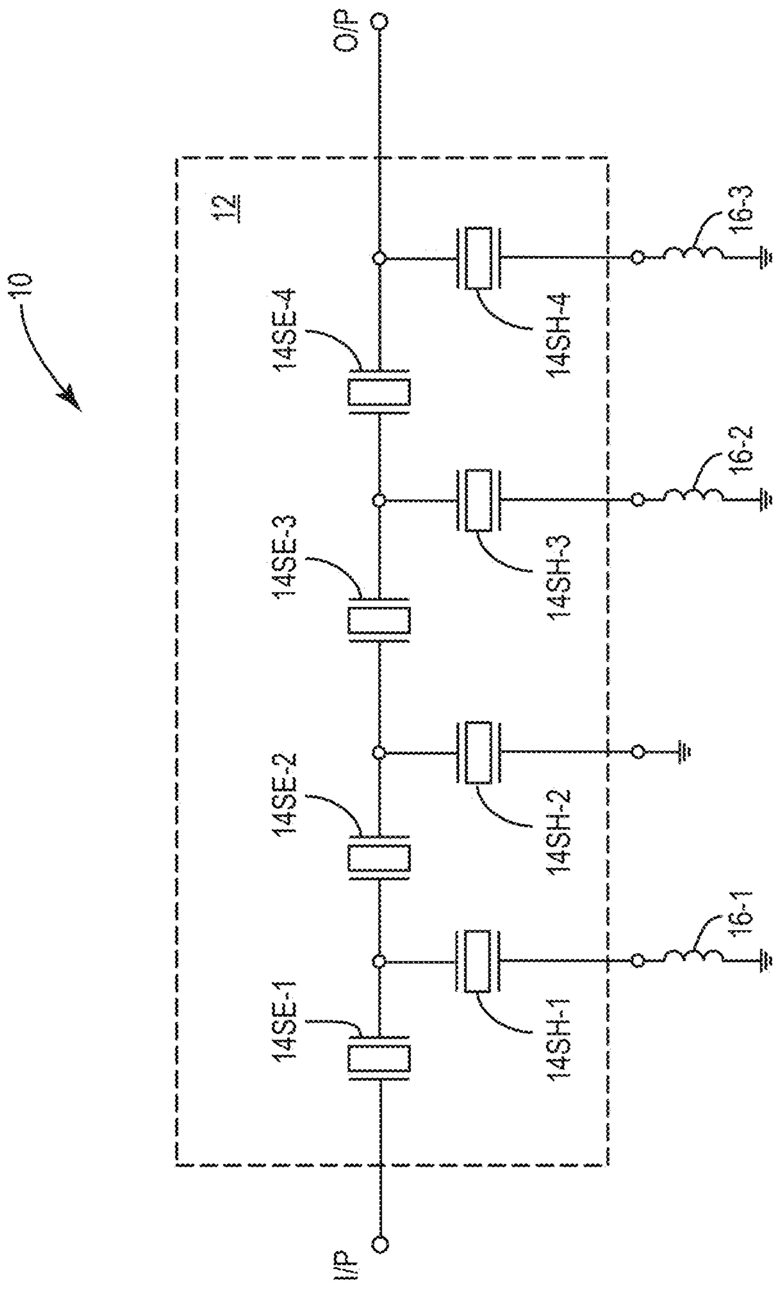
FIGS. 1A-1E illustrate schematics of an exemplary acoustic filter that includes an acoustic device die and multiple inductors according to some embodiments of the present disclosure.

It will be understood that for clear illustrations, FIGS. 1A-10 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Acoustic filters, such as Bulk Acoustic Wave (BAW) filters and Surface Acoustic Wave (SAW) filters, are important building blocks of modern radio frequency (RF) front-end systems due to their small size, low cost and high performance. The acoustic filters are widely used in mobile and handheld devices. Typically, an acoustic filter at least includes an acoustic device die that is composed of multiple acoustic resonators (e.g., BAW resonators or SAW resonators). In order to achieve enhanced performance of the acoustic filter, like enhanced bandwidth of the acoustic filter and/or an enhanced out-of-band rejection level, one or more inductors are introduced to the acoustic filter and electrically connected to certain acoustic resonators of the acoustic device die.

FIGS. 1A-1E illustrate schematics of an exemplary acoustic filter 10 that includes one or more inductors and an acoustic device die composed of multiple acoustic resonators according to some embodiments of the present disclosure. In FIG. 1A, the acoustic filter 10 has an acoustic device die 12 with multiple resonators 14. For the purpose of this illustration, the acoustic device die 12 is a four-stage device with a ladder configuration, which includes four series resonators 14SE (e.g., a first series resonator 14SE-1, a second series resonator 14SE-2, a third series resonator 14SE-3, and a fourth series resonator 14SE-4) and four shunt resonators 14SH (e.g., a first shunt resonator 14SH-1, a second shunt resonator 14SH-2, a third shunt resonator 14SH-3, and a fourth shunt resonator 14SH-4). The four series resonators 14SE are coupled in series between an input port (I/P) and an outport (O/P), while each shunt resonator 14SH is arranged between a corresponding series resonator 14SE and ground. Each series/shunt resonator 14 may be a BAW resonator or a SAW resonator.

Herein, the acoustic filter 10 further includes several shunt inductors 16 (e.g., a first shunt inductor 16-1, a second shunt inductor 16-2, and a third shunt inductor 16-3) coupled between certain ones of the shunt resonators 14SH and ground, respectively. In one embodiment, the first shunt inductor 16-1 is coupled between the first shunt resonator 14SH-1 and ground, the second shunt inductor 16-2 is coupled between the third shunt resonator 14SH-3 and ground, and the third shunt inductor 16-3 is coupled between the fourth shunt resonator 14SH-4 and ground, while the second shunt resonator 14SH-2 is directly coupled to ground.

Figure 1B:
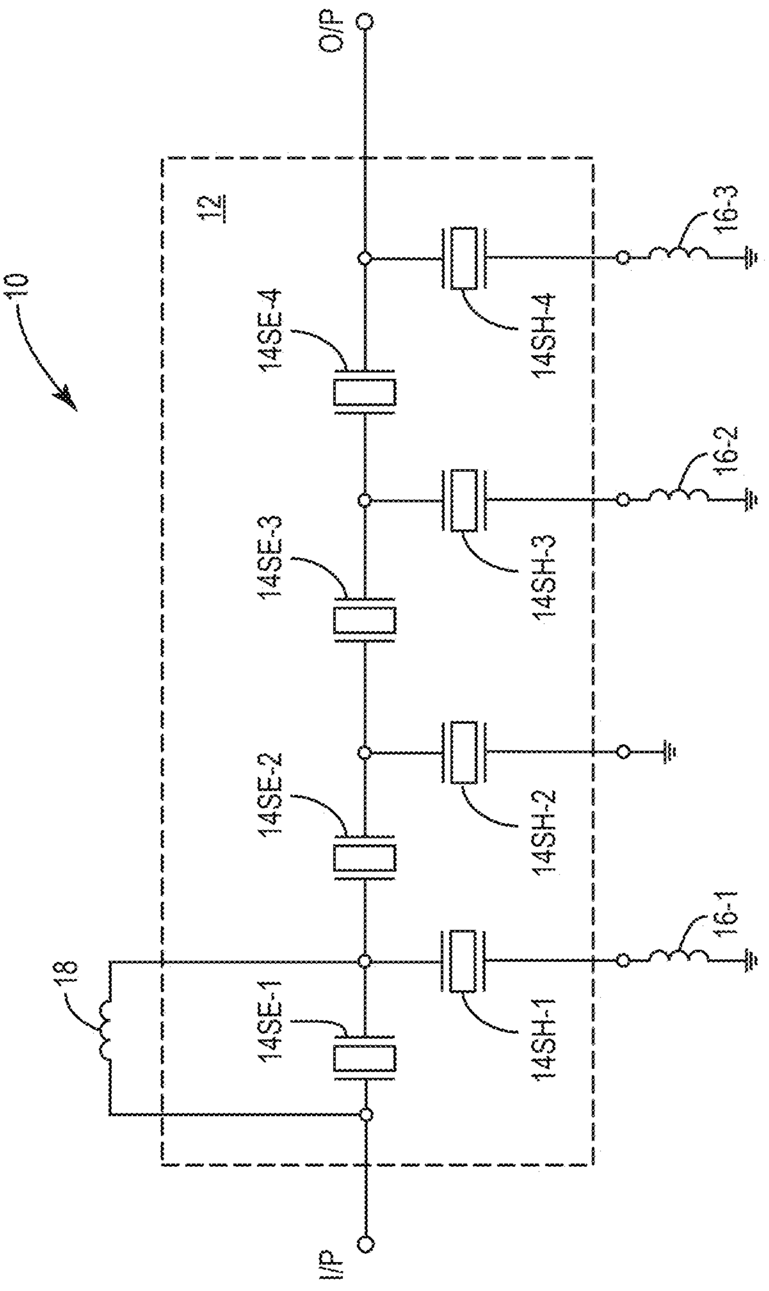
Figure 1C:
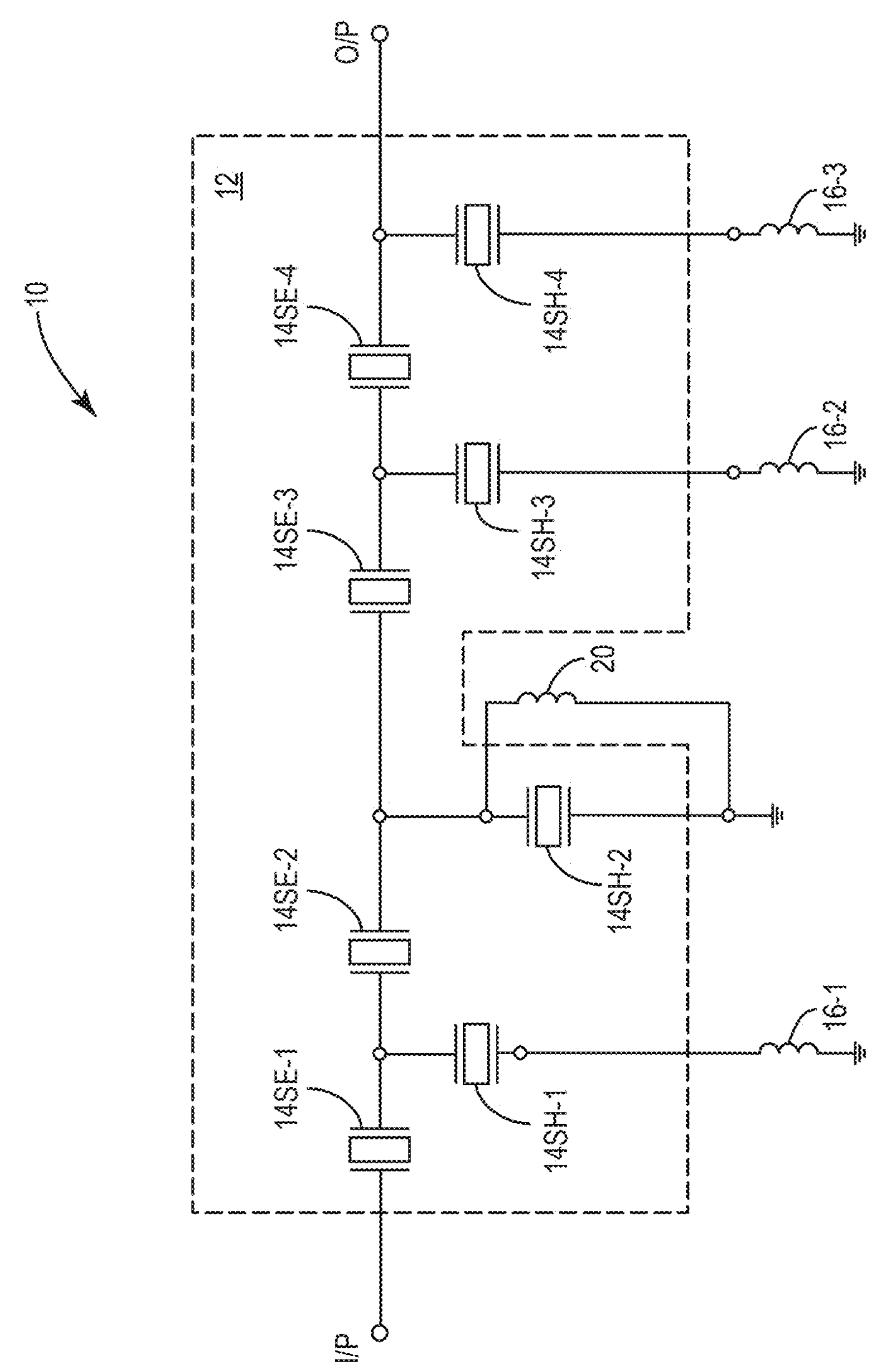
Figure 1D:
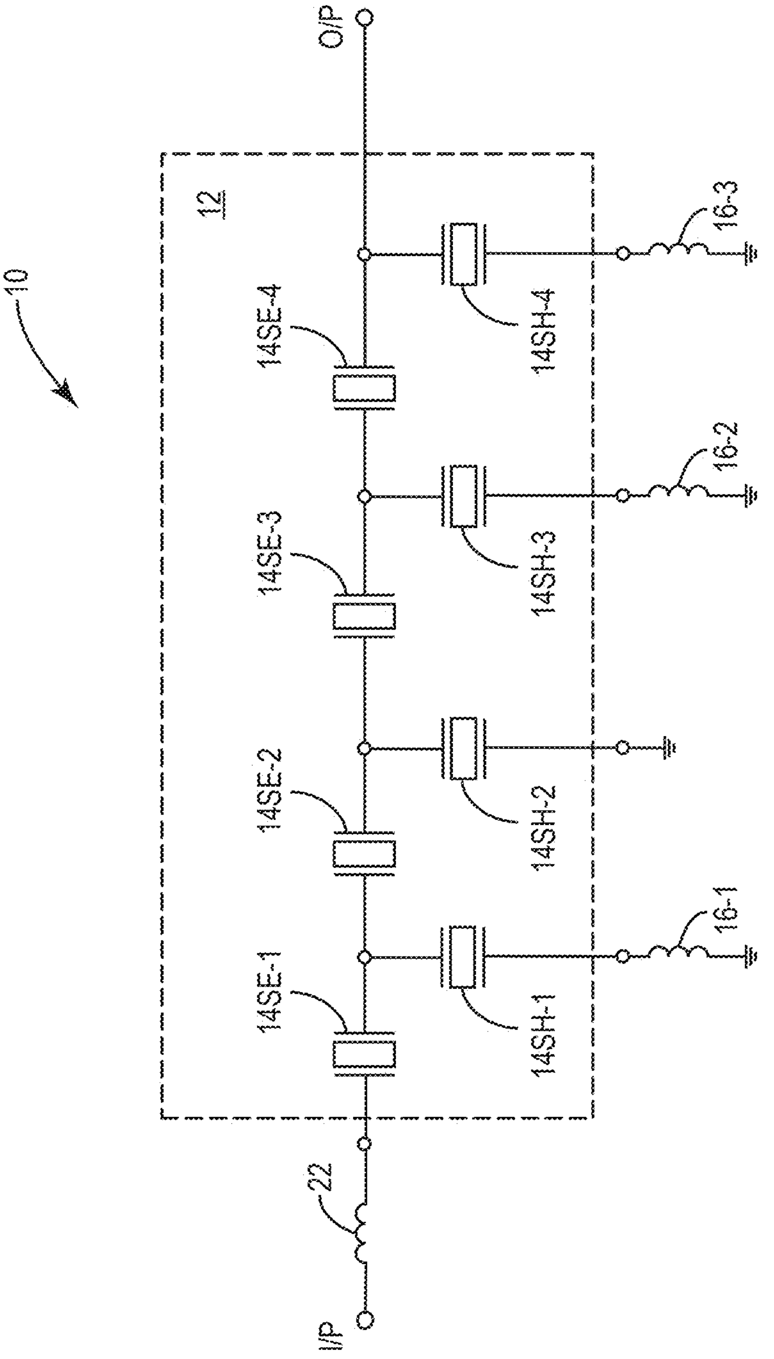
Figure 1E:
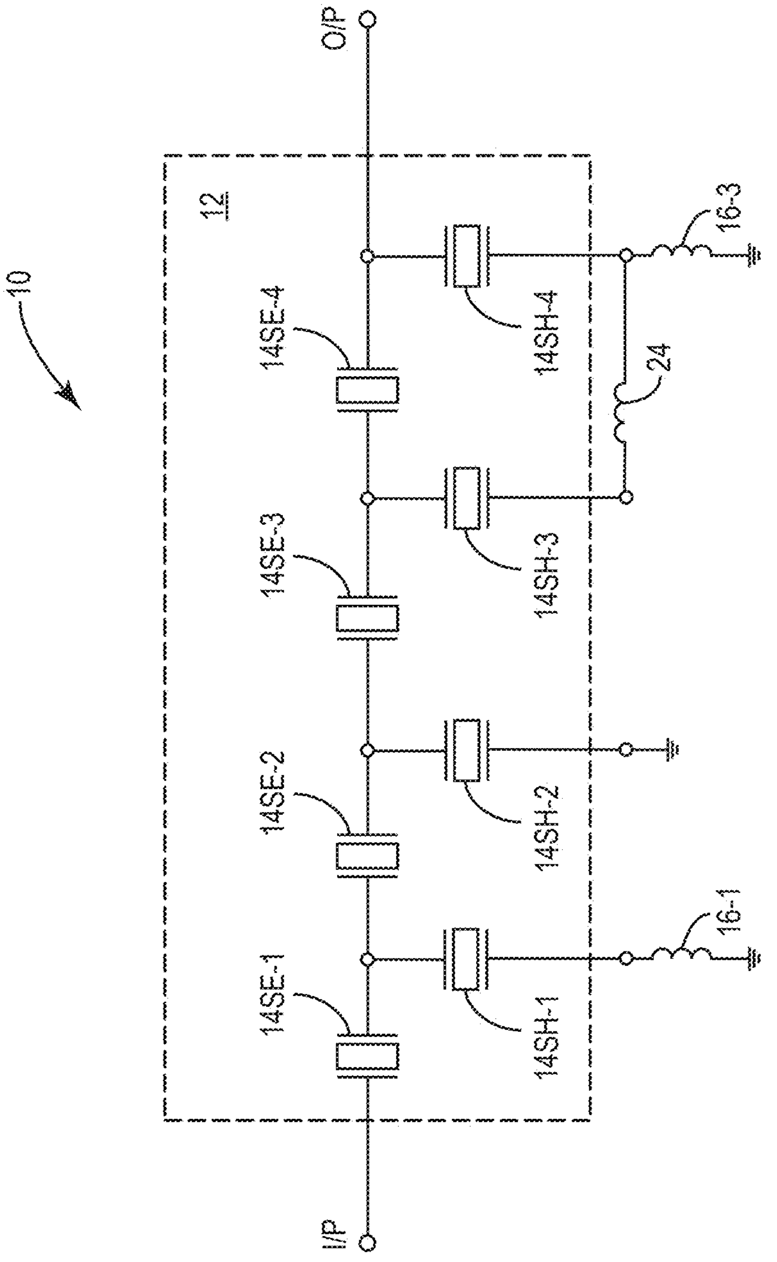

In FIG. 1B, besides the three shunt inductors 16, the acoustic filter 10 also includes a first parallel inductor 18 that is parallel with one series resonator 14SE. In one embodiment, the first parallel inductor 18 is parallel with the first series resonator 14SE-1. Alternatively, in FIG. 1C, besides the three shunt inductors 16, the acoustic filter 10 includes a second parallel inductor 20 that is parallel with one shunt resonator 14SH. In one embodiment, the second parallel inductor 20 is parallel with the second shunt resonator 14SH-2. In FIG. 1D, besides the three shunt inductors 16, the acoustic filter 10 further includes a series inductor 22 that is in series with the series resonators 14SE. In one embodiment, the series inductor 22 is coupled between the I/P and the first series resonator 14SE-1. In some applications, two or more shunt stages may share a common inductor. As shown in FIG. 1E, the first shunt inductor 16-1 is still coupled between the first shunt resonator 14SH-1 and ground, and the second shunt resonator 14SH-2 is still directly coupled to ground. The third shunt resonator 14SH-3 and the fourth shunt resonator 14SH-4 are both coupled to ground through the third shunt inductor 16-3, and a connection inductor 24 is coupled between the third shunt resonator 14SH-3 and the third shunt inductor 16-3 (i.e., the second shunt inductor 16-2 is omitted, the third shunt inductor 16-3 is coupled between the fourth shunt resonator 14SH-4 and ground, and the connection inductor 24 and the third shunt inductor 16-3 are coupled in series between the third shunt resonator 14SH-3 and ground).

Note that the schematics shown in FIGS. 1A-1E are non-limiting examples of the acoustic filter 10. In different applications, the acoustic device die 12 of the acoustic filter 10 may have fewer or more stages and include fewer or more acoustic resonators 14 with different topologies/configurations (e.g., a ladder configuration and/or a lattice configuration). In addition, the acoustic filter 10 may include fewer or more inductors 16, 18, 20, 22, and/or 24, each of which may be in series with or in parallel with a corresponding acoustic resonator 14. Furthermore, the acoustic filter 10 can expand to any combination of multiple acoustic resonators and inductors.

In a typical manufacturing implementation, the acoustic device die 12 including the acoustic resonators 14 is mounted on a laminate, which includes a number of metal layers and dielectric layers formed alternately. To avoid using a large amount of laminate real estate and/or avoid a large number of metal layers, the inductors included in the acoustic filter 10 (e.g., the inductors 16/18/20/22/24 as shown in FIGS. 1A-1E) are not implemented entirely by relying on the metal layer within the laminate. Instead, the inductors included in the acoustic filter 10 are proposed to be implemented by at least one or more bond-wires (BWs) formed over the laminate and one or a few metal layers of the laminate.

Figure 2A:
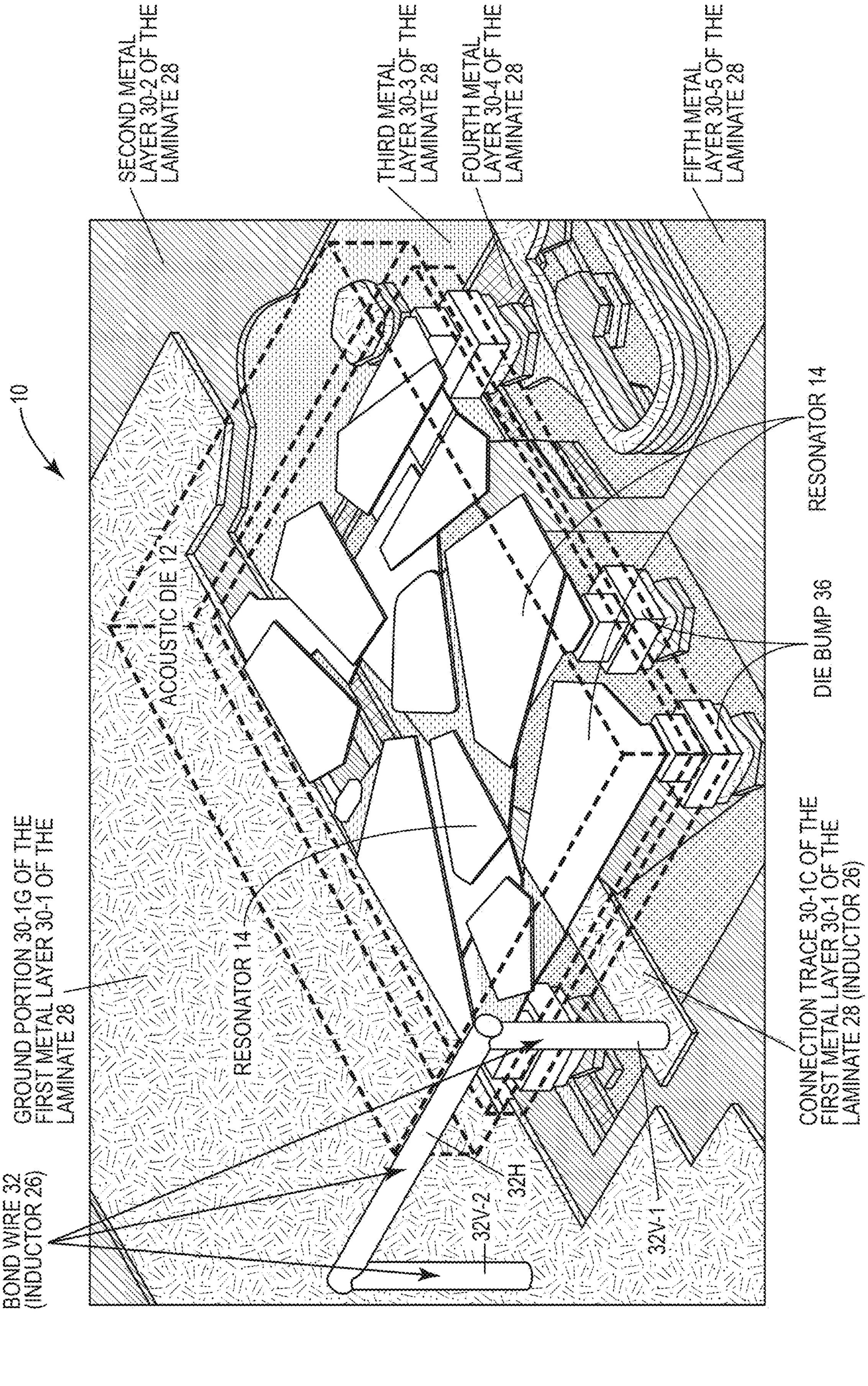
FIGS. 2A-2C illustrate an exemplary implementation of the acoustic filter with one laminate-based and bond-wire based inductor according to some embodiments of the present disclosure.
Figure 2B:
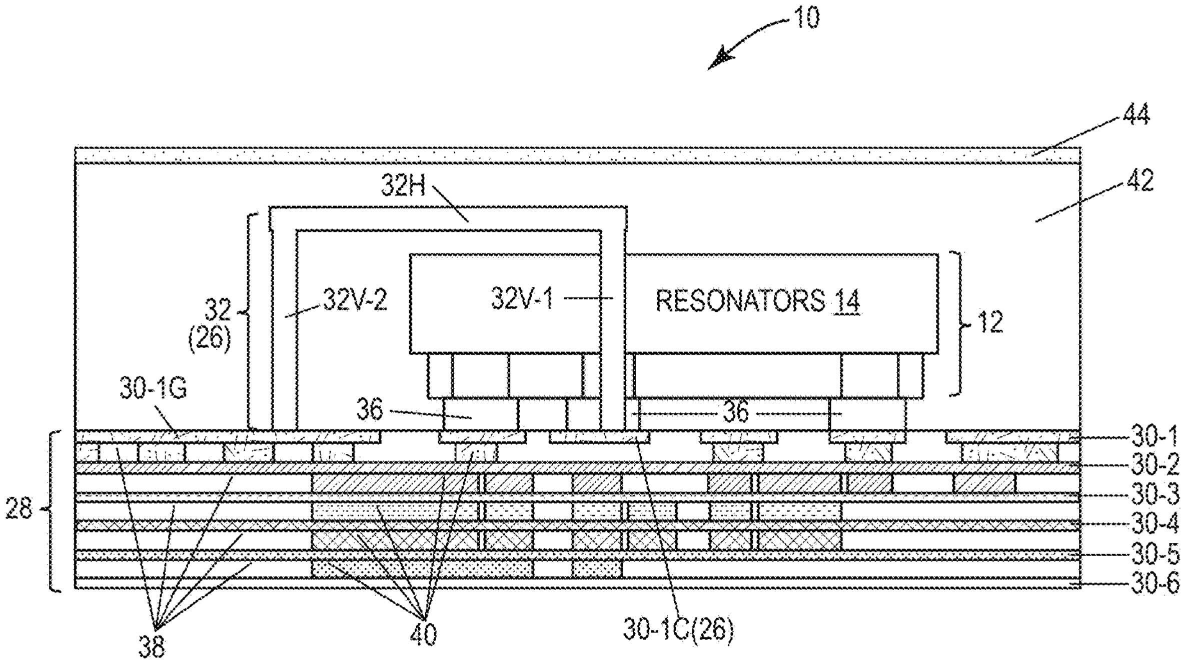
Figure 2C:
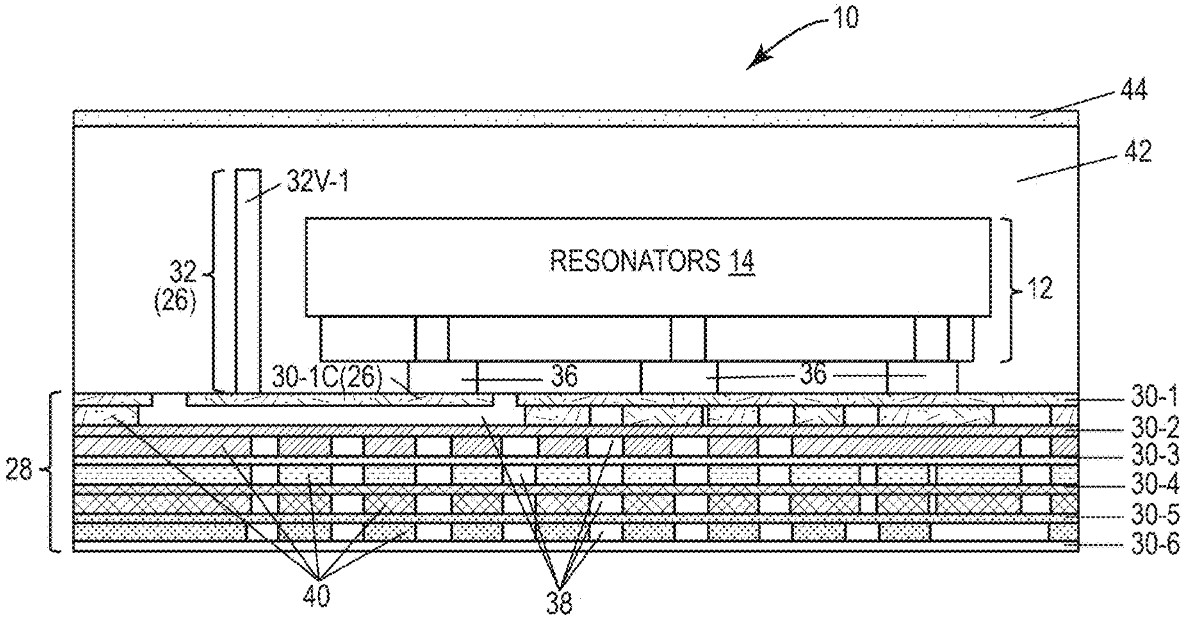

For simplicity and clarity, FIGS. 2A-2C illustrate an exemplary implementation of the acoustic filter 10 with one inductor 26 that is both laminate-based and BW-based. Herein, the inductor 26 might be one of the inductors 16, 18, 20, 22, and 24 shown in FIGS. 1A-1E. In an actual implementation of the acoustic filter 10, multiple inductors (e.g., the inductors 16/18/20/22/24 shown in FIGS. 1A-1E) might be included, and each inductor might be implemented in a similar manner as the inductor 26. FIG. 2A is a three-dimensional view of the acoustic filter 10, FIG. 2B is a front view of the acoustic filter 10, and FIG. 2C is a side view of the acoustic filter 10.

In detail, the acoustic filter 10 includes a laminate 28 with multiple metal layers 30 (e.g., a first metal layer 30-1, a second metal layer 30-2, a third metal layer 30-3, a fourth metal layer 30-4, a fifth metal layer 30-5, and a sixth metal layer 30-6), the acoustic device die 12 with multiple resonators 14 (only certain ones of the resonators are labeled with reference numbers for clarity), and a BW 32. Herein, both the laminate 28 and the BW 32 are used for providing inductance in the acoustic filter 10.

Besides the metal layers 30, the laminate 28 also includes dielectric layers 38 (only certain portions of the dielectric layers 38 are labeled with reference numbers for clarity) vertically alternating with the metal layers 30, and metal vias 40 (only certain ones of the metal vias are labeled with reference numbers for clarity) configured to connect different metal layers 30 through the dielectric layers 38. For the purpose of this illustration, the first metal layer 30-1 is at a top surface of the laminate 28, the second metal layer 30-2 is formed underneath the first metal layer 30-1, the third metal layer 30-3 is formed underneath the second metal layer 30-2, the fourth metal layer 30-4 is formed underneath the third metal layer 30-3, the fifth metal layer 30-5 is formed underneath the fourth metal layer 30-4, and the sixth metal layer 30-6 is formed underneath the fifth metal layer 30-5 and may be used as a ground layer for the acoustic filter 10. Due to different applications, each metal layer 30 may include multiple separate layer portions. In different applications, the laminate 28 may include fewer or more metal layers 30 and corresponding fewer or more dielectric layers 38.

The acoustic device die 12 is mounted on the first metal layer 30-1 of the laminate 28 through die bumps 36 (only certain ones of the die bumps are labeled with reference numbers for clarity). A connection between each electrode of one resonator 14 and a corresponding inductor 26 (e.g., any inductor 16/18/20/22/24 shown in FIGS. 1A-1E, formed partially from the laminate 28) requires one die bump 36. As such, only one die bump 36 is needed for connection between each of the shunt inductors 16, the series inductor 22, and the connection inductor 24 and the corresponding resonator 14 within the acoustic device die 12. Two die bumps 36 are needed for connection between each of the first and second parallel inductors 18 and 20 and the corresponding resonator (e.g., the first series resonator 14SE-1 or the second shunt resonator 14SH-2) within the acoustic device die 12. The internal connection between the series resonators 14SE is typically implemented within the acoustic device die 12, but does not use metal elements (e.g., the metal layers 30 of the laminate 28, or the BW 32) outside the acoustic device die 12.

In one embodiment, one resonator 14 included in the acoustic device die 12 (e.g., the first shunt resonator 14SH-1 shown in FIGS. 1A-1E) is coupled to a connection trace 30-1C of the first metal layer 30-1 through a corresponding die bump 36. The BW 32 is formed over the laminate 28 and configured to connect the connection trace 30-1C of the first metal layer 30-1 to a ground portion 30-1G of the first metal layer 30-1. The ground portion 30-1G is separate from the connection trace 30-1C and is coupled to ground. Herein, both the BW 32 and the connection trace 30-1C of the first metal layer 30-1 constitute the inductor 26, such as one shunt inductor 16 or the second parallel inductor 20 shown in FIGS. 1A-1E. Herein, one resonator 14 is coupled to ground through the inductor 26 formed by the combination of the BW 32 and the connection trace 30-1C from the laminate 28. In another embodiment, the BW 32 may be configured to connect the connection trace 30-1C to a non-grounded trace of the first metal layer 30-1, which is separate from the connection trace 30-1C but is not grounded (not shown). As such, the inductor 26 will be formed by the combination of the BW 32, the connection trace 30-1C of the first metal layer 30-1 from the laminate 28, and the non-grounded trace of the first metal layer 30-1 from the laminate 28.

In a non-limiting example, the BW 32 consists of two vertical sections 32V (e.g., a first vertical section 32V-1 and a second vertical section 32V-2) and one horizontal section 32H. The first vertical section 32V-1 of the BW 32 is attached to the connection trace 30-1C of the first metal layer 30-1 on the top surface of the laminate 28 at one end and attached to a first end of the horizontal section 32H of the BW 32 on the other end. The second vertical section 32V-2 of the BW 32 is attached to the ground portion 30-1G of the first metal layer 30-1 on the top surface of the laminate 28 at one end and attached to a second end of the horizontal section 32H of the BW 32 on the other end. Herein, the BW 32 has three sections with a Pi-shaped structure. In different applications, fewer or more sections can be included in the BW 32. Also, other geometry structures can be used for the BW 32, for example an inverted U-shaped structure, an inverted V-shaped structure and more.

The combination of the connection trace 30-1C of the first metal layer 30-1 and the BW 32 can be designed to achieve a required inductance value needed by the acoustic filter 10. For different applications, the length and shape of the connection trace 30-1C, and/or the length and structure of the BW 32 can be modified.

Note that the BW 32 in the acoustic filter 10 is not in contact with the acoustic device die 12, and is not configured to connect the acoustic device die 12 to the laminate 28 (the die bumps 36 are configured to connect the acoustic device die 12 to the laminate 28). Herein, the BW 32 is only configured to provide extra inductance to the acoustic filter 10. Using a BW for inductor implementation on a top surface of a laminate allows for minimal usage of metal layers within the laminate (especially bottom metal layers) for inductance in the laminate and frees them for use in other connections and routing. As a result, better isolation can be achieved among RF signals, digital signals, power supply, control signals, or other system functions that are typically implemented in the laminate and require separation with large ground layers in the laminate. In addition, the BW-based inductors suffer less from parasitic capacitance and dielectric losses and can provide high quality factors. Reducing the use of the metal layers in the laminate for inductance results in reduction of the laminate cost as well as the thickness of the final product.

Furthermore, the combination of the connection trace 30-1C from the laminate 28 and the BW 32 can be used to implement not only one shunt inductor 16, but also, at least a part of, the first parallel inductor 18, the second parallel inductor 20, the series inductor 22, or the connection inductor 24 shown in FIGS. 1B-1E. The connection trace 30-1C from the laminate 28 is always in series with the BW 32. The implementation of the first parallel inductor 18 may be achieved by the connection trace 30-1C of the first metal layer 30-1, the BW 32, and a non-grounded trace of the first metal layer 30-1 connected to the BW 32 (not shown). The combination of the BW 32, the connection trace 30-1C of the first metal layer 30-1, and the non-grounded trace of the first metal layer 30-1 is coupled between two die bumps 36 respectively connected to two electrodes of the first series resonator 14SE-1 within the acoustic device die 12, such that the first parallel inductor 18 (implemented by the combination of the BW 32, the connection trace 30-1C of the first metal layer 30-1, and the non-grounded trace of the first metal layer 30-1) can be parallel to the first series resonator 14SE-1. Similarly, the implementation of the second parallel inductor 20 may also be achieved by the connection trace 30-1C of the first metal layer 30-1, the BW 32, and a non-grounded trace of the first metal layer 30-1 connected to the BW 32 (not shown). The combination of the BW 32, the connection trace 30-1C of the first metal layer 30-1, and the non-grounded trace of the first metal layer 30-1 is coupled between two die bumps 36 respectively connected to two electrodes of the second shunt resonator 14SH-2 within the acoustic device die 12, such that the second parallel inductor 20 (implemented by the combination of the BW 32, the connection trace 30-1C of the first metal layer 30-1, and the non-grounded trace of the first metal layer 30-1) can be parallel to the second shunt resonator 14SH-2.

The implementation of the series inductor 22 may be achieved by the connection trace 30-1C of the first metal layer 30-1, the BW 32, and a non-grounded trace of the first metal layer 30-1 connected to the BW 32 (not shown). The combination of the BW 32, the connection trace 30-1C of the first metal layer 30-1, and the non-grounded trace of the first metal layer 30-1 is coupled between the I/P and one die bump 36 connected to one electrode of the first series resonator 14SE-1 within the acoustic device die 12, such that the series inductor 22 (implemented by the combination of the BW 32, the connection trace 30-1C of the first metal layer 30-1, and the non-grounded trace of the first metal layer 30-1) can be in series with the first series resonator 14SE-1.

In addition, the implementation of the connection inductor 24 may be achieved by the connection trace 30-1C of the first metal layer 30-1, the BW 32, and a non-grounded trace of the first metal layer 30-1 connected to the BW 32 (not shown). The combination of the BW 32, the connection trace 30-1C of the first metal layer 30-1, and the non-grounded trace of the first metal layer 30-1 is coupled between one die bump 36 connected to one electrode of the third shunt resonator 14SH-3 and another die bump 36 connected to one electrode of the fourth shunt resonator 14SH-4, such that the connection inductor 24 (implemented by the combination of the BW 32, the connection trace 30-1C of the first metal layer 30-1, and the non-grounded trace of the first metal layer 30-1) connects the third shunt resonator 14SH-3 and the fourth shunt resonator 14SH-4.

In some applications, the implemented acoustic filter 10 also includes a mold compound 42 and a shielding structure 44. The mold compound 42 is formed over the laminate 28 to encapsulate and underfill the acoustic device die 12 (i.e. fill gaps among the die bumps 36), and to encapsulate the BW 32. Typically, the mold compound 42 may be an organic epoxy resin system. The shielding structure 44 is electrically coupled to ground (not shown) and covers at least a top surface of the mold compound 42, so as to provide external shielding for the acoustic device die 12 and the inductor 26 from the external environment. The shielding structure 44 may also cover sides of the mold compound 42 and sides of the laminate 28 (not shown), while a bottom surface of the laminate 28 is exposed. The shielding structure 44 may consist of two or three metal layers (not shown), which may be formed of copper, aluminum, silver, gold, nickel, and/or other conductive materials.

Figure 3:
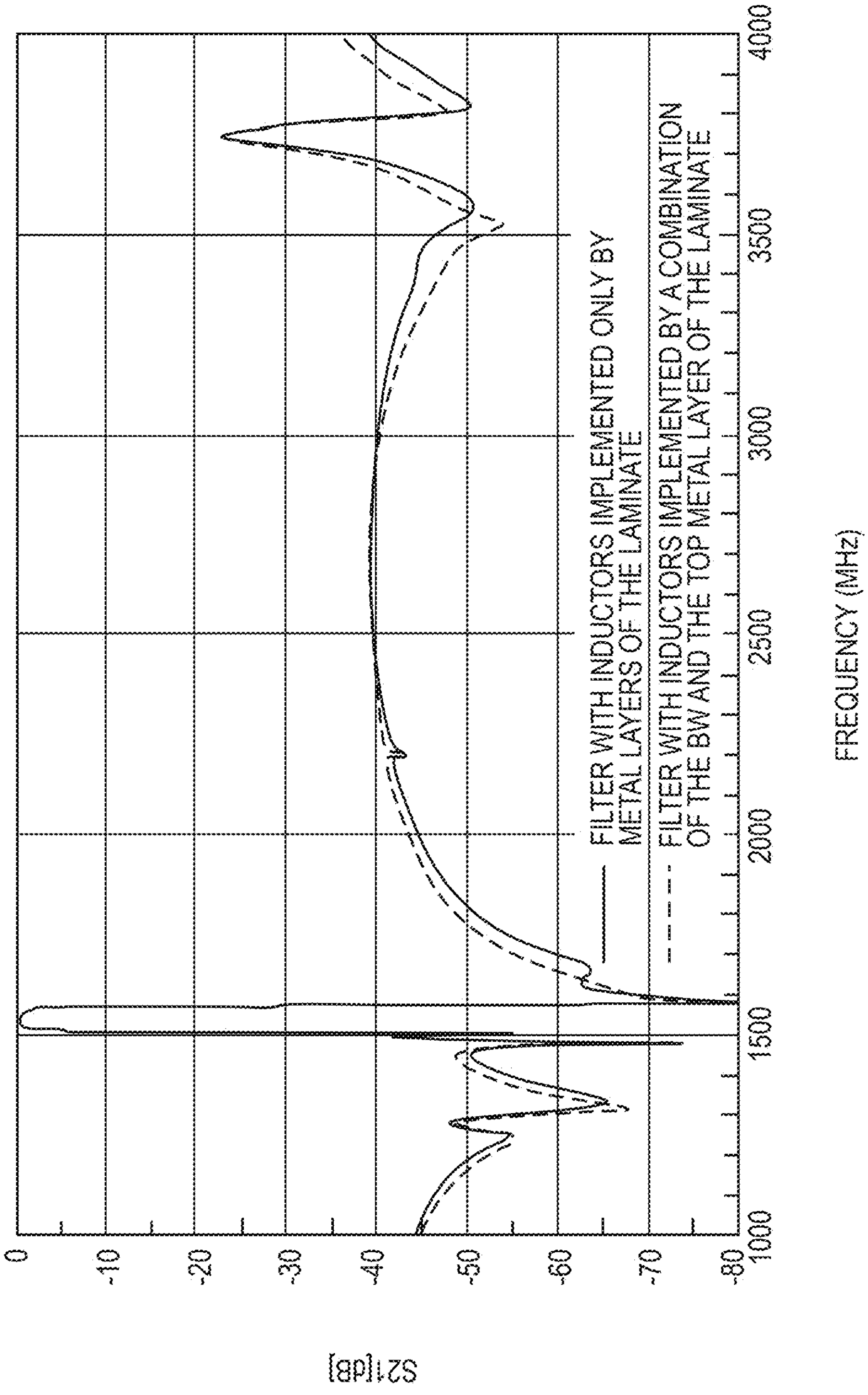
FIG. 3 illustrates an electrical response comparison of the same acoustic filter structure with different inductor implementations.

FIG. 3 illustrates an electrical response comparison of the same acoustic filter structure (e.g., shown in FIG. 1A) with different inductor implementations. The solid line represents the acoustic filter structure with inductors implemented only by metal layers embedded in the laminate, and the dashed line represents the acoustic filter structure with inductors implemented by a combination of the BW and the top metal layer of the laminate. When the lengths and/or shapes of the BW and the top laminate metal layer are carefully selected, the combination of the BW and the top laminate metal layer can achieve a same inductance value as the conventional all laminate-based implementation (i.e., by multiple metal layers in the laminate). The solid and dashed lines shown in FIG. 3 are in close agreement showing that the acoustic filter is capable of maintaining essentially a same passband and out of band performance.

Figure 4:
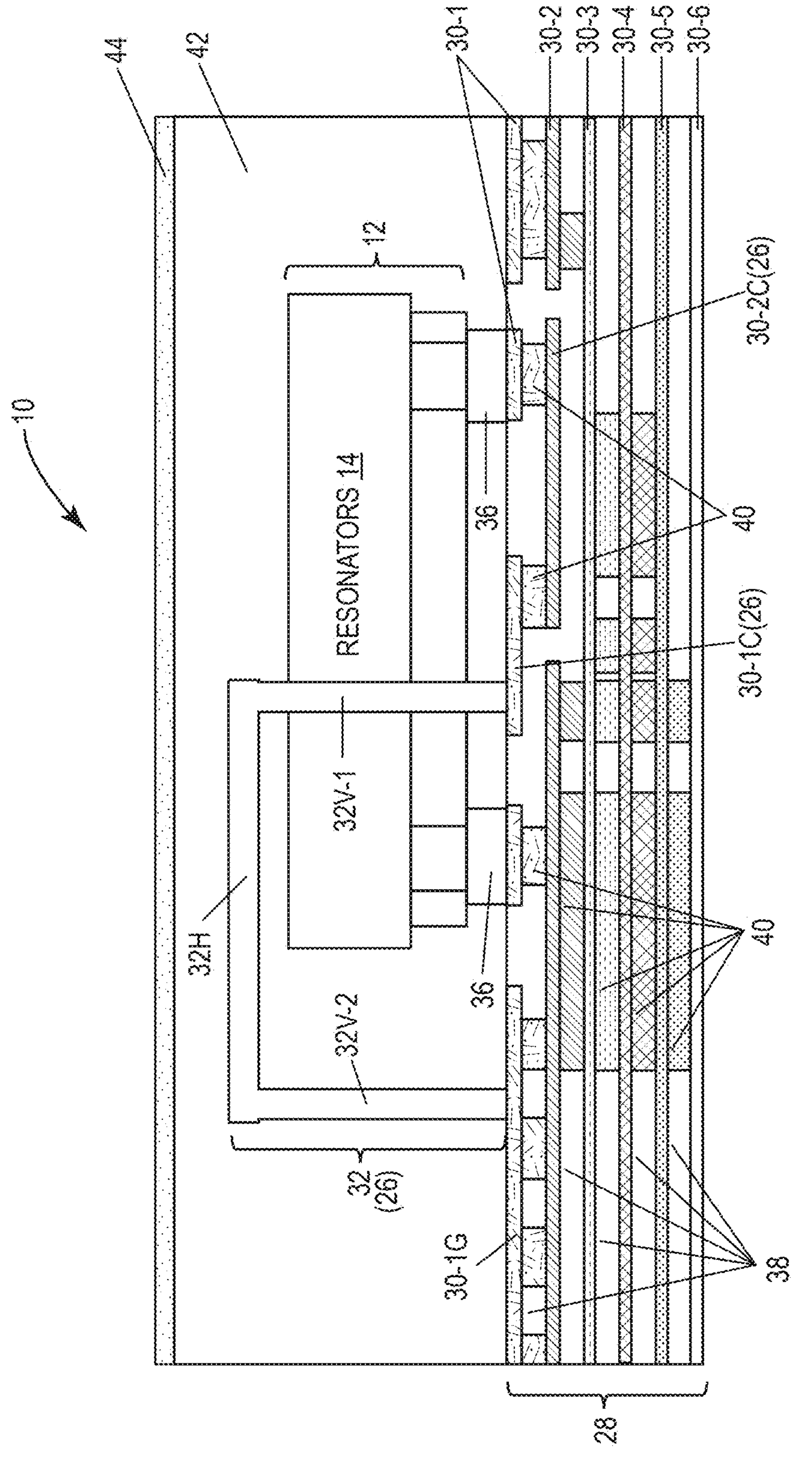
FIGS. 4-8 illustrate alternative implementations of one inductor utilized in the acoustic filter shown in FIGS. 1A-1E.

In FIGS. 2A-2C, the inductor 26 in the acoustic filter 10 is implemented by the BW 32 and a part of the first metal layer 30-1 (i.e., the connection trace 30-1C). In some applications, more than one metal layer 30 of the laminate 28 may be utilized for the implementation of the inductor 26, as illustrated in FIG. 4. For the purpose of this illustration, one resonator 14 included in the acoustic device die 12 (e.g., one shunt resonator 14SH shown in FIGS. 1A-1E) is coupled to a second connection trace 30-2C of the second metal layer 30-2 through a corresponding die bump 36, a corresponding metal via 40, and a small portion of the first metal layer 30-1 in between. Another end of the second connection trace 30-2C of the second metal layer 30-2 is coupled to the connection trace 30-1C of the first metal layer 30-1 through another metal via 40. The BW 32 is still formed over the laminate 28 and configured to connect the connection trace 30-1C of the first metal layer 30-1 and the ground portion 30-1G of the first metal layer 30-1. As such, the BW 32, the connection trace 30-1C of the first metal layer 30-1, and the second connection trace 30-2C of the second metal layer 30-2 constitute the inductor 26. By changing the lengths of the BW 32, the connection trace 30-1C, and/or the second connection trace 30-2C, the inductance of the inductor 26 will vary. For different applications, portions of other metal layer(s) 30 (besides the first and second metal layer 30-1 and 30-2) of the laminate 28 may also be utilized to constitute the inductor 26 (not shown).

Figure 5A:
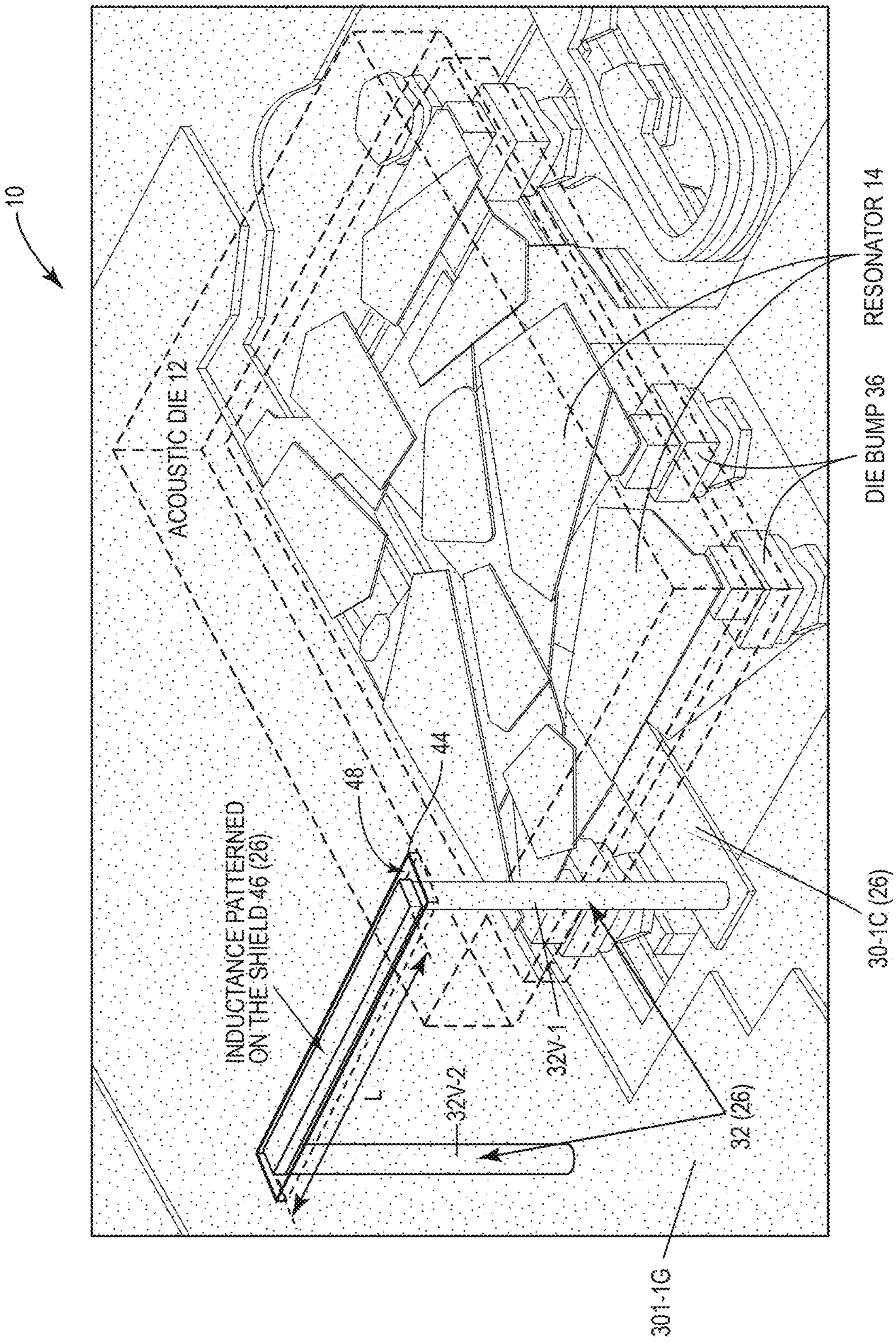
Figure 5B:
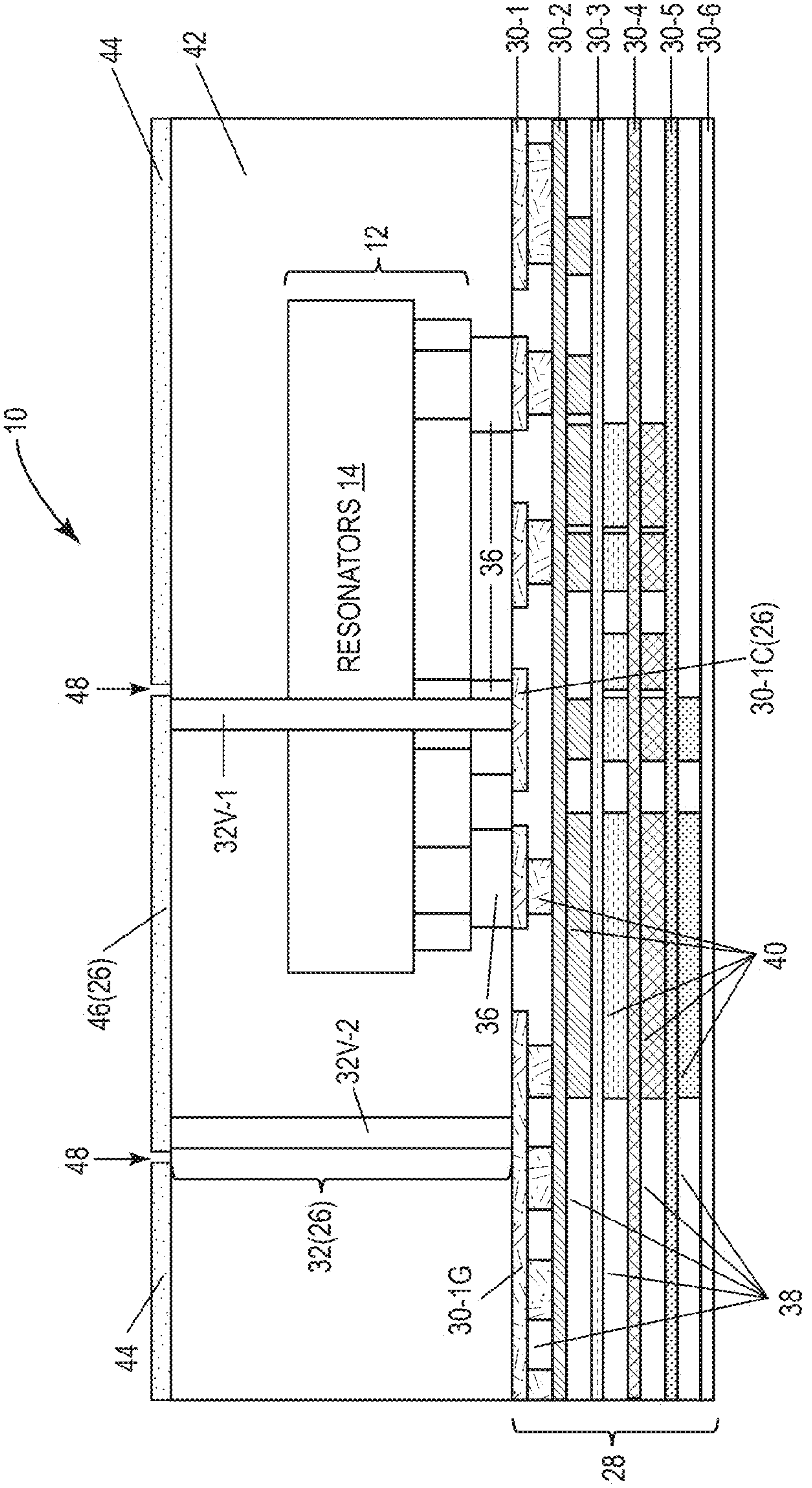

FIGS. 5A-5B illustrate an alternative implementation of the inductor 26 utilized in the acoustic filter 10 according to some embodiments of the present disclosure. Herein, over the top surface of the mold compound 42, beside the shielding structure 44, there is also an isolated shielding strip 46, which is separate from the shielding structure 44 by a gap 48. The isolated shielding strip 46 and the shielding structure 44 are formed from the same metal layers. In this case, the BW 32 only includes the first and the second vertical sections 32V-1 and 32V-2, but no horizontal section 32H. The two vertical sections 32V extend through the mold compound 42 and are in contact with two ends of the isolated shielding strip 46, respectively. In other words, the isolated shielding strip 46 electrically connects the first vertical section 32V-1 and the second vertical section 32V-2. The first vertical section 32V-1 is still coupled to the connection trace 30-1C of the first metal layer 30-1, and the second vertical section 32V-2 is still coupled to the ground portion 30-1G of the first metal layer 30-1. As such, the inductor 26 is composed of the connection trace 30-1C of the first metal layer 30-1, the BW 32 (i.e., the first and the second vertical sections 32V-1 and 32V-2), and the isolated shielding strip 46 formed from the same metal layers as the shielding structure 44. In one embodiment, the isolated shielding strip 46 may be formed by patterning a strip from a continuous shielding structure.

Figure 6:
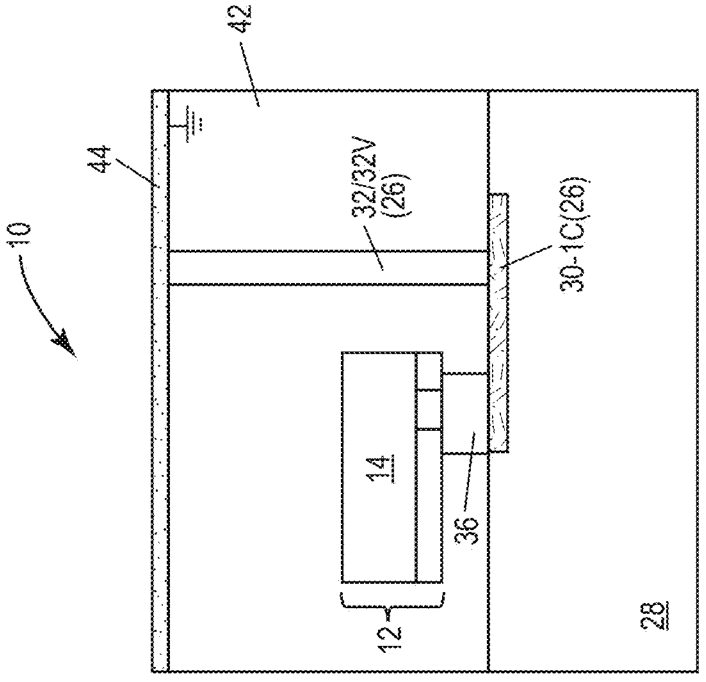
Figure 7:
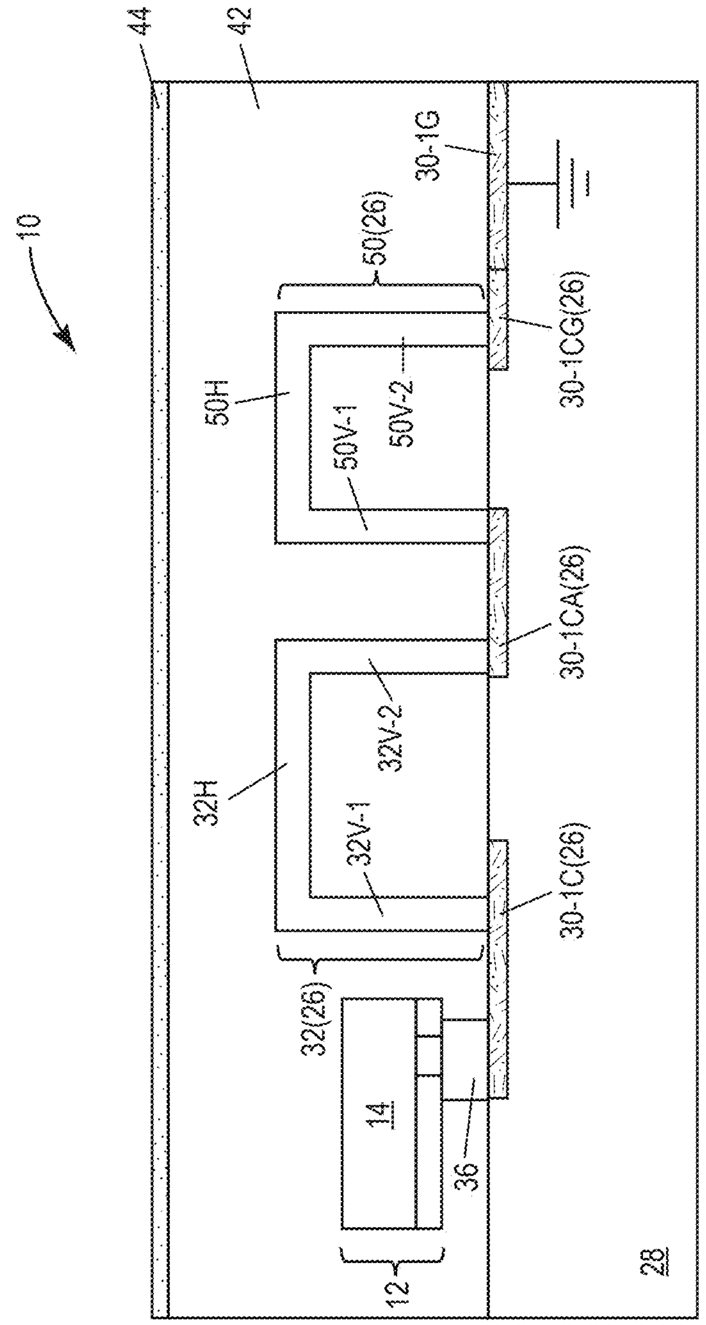
Figure 8:
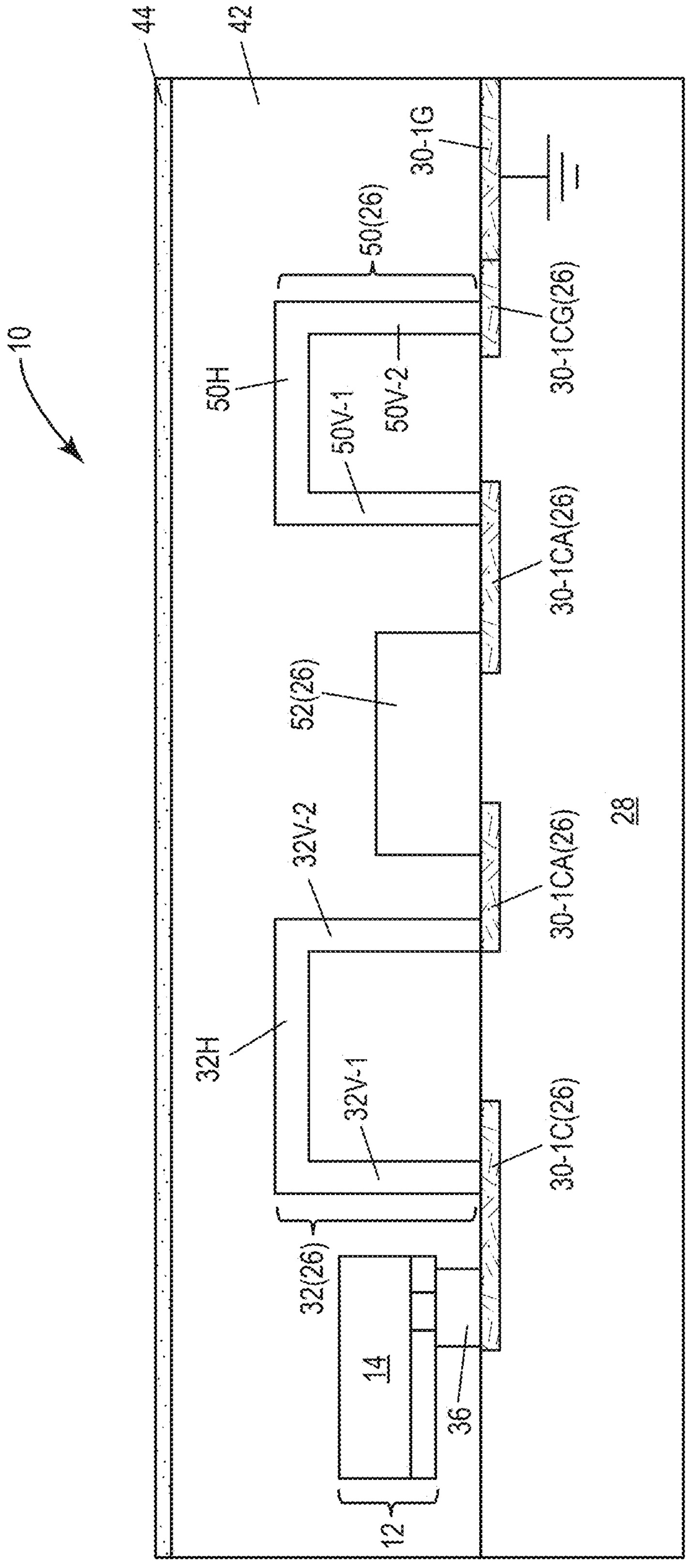

FIGS. 6-8 illustrate other alternative implementations of the inductor 26 in the acoustic filter 10. In one embodiment, the BW 32 as a part of the inductor 26 only includes one vertical section 32V as shown in FIG. 6. Herein, the acoustic die 12/one resonator 14 is still electrically coupled to the connection trace 30-1C on the top surface of the laminate 28 through the corresponding die bump 36. Rather than connecting the connection trace 30-1C to the ground portion 30-1G of the first metal layer 30-1, the BW 32 is configured to connect the connection trace 30-1C from the laminate 28 to the grounded shielding structure 44. In particular, the BW 32 extends vertically through the mold compound 42, a bottom end of the BW 32 is in contact with the connection trace 30-1C from the laminate 28, and a top end of the BW 32 is in contact with the shielding structure 44 covering the top surface of the mold compound 42. As such, the inductor 26, which connects the acoustic die 12/one resonator 14 to ground (e.g., one shunt inductor 16 shown in FIGS. 1A-1E), is composed of the connection trace 30-1C from the laminate 28 and the vertical-section BW 32.

In some cases, the inductor 26 included in the acoustic filter 10 needs a relatively large inductance. As such, multiple connection traces and multiple BWs might be utilized to implement the inductor 26, as shown in FIG. 7. For the purpose of this illustration, besides the BW 32, the acoustic filter 10 also includes a secondary BW 50, which is not directly connected to the BW 32. Besides the connection trace 30-1C and the ground portion 30-1G, the first metal layer 30-1 may also include an auxiliary connection trace 30-1CA and a ground connection trace 30-1CG. The auxiliary connection trace 30-1CA is separate from the connection trace 30-1C and the ground portion 30-1G, while the ground connection trace 30-1CG is separate from the connection trace 30-1C and the connection trace 30-1CA but connected to the ground portion 30-1G. Herein, the acoustic die 12/one resonator 14 is still electrically coupled to the connection trace 30-1C of the laminate 28 through the corresponding die bumps 36. Both the BW 32 and the secondary BW 50 are formed over the top surface of the laminate 28. The BW 32 is configured to connect the connection trace 30-1C to the auxiliary connection traces 30-1CA of the first metal layer 30-1, while the secondary BW 50 is configured to connect the auxiliary connection trace 30-1CA to the ground portion 30-1G through the ground connection trace 30-1CG. As such, the inductor 26, which connects the acoustic die 12/one resonator 14 to ground (e.g., one shunt inductor 16 shown in FIGS. 1A-1E), is composed of the connection trace 30-1C of the laminate 28, the BW 32, the auxiliary connection trace 30-1CA of the laminate 28, the secondary BW 50, and the ground connection trace 30-1CG of the laminate 28.

For some applications, the ground connection trace 30-1CG is omitted (not shown), and the secondary BW 50 is configured to directly connect the auxiliary connection trace 30-1CA to the ground portion 30-1G. As such, the inductor 26, which connects the acoustic die 12/one resonator 14 to ground (e.g., one shunt inductor 16 shown in FIGS. 1A-1E), is composed of the connection trace 30-1C of the laminate 28, the BW 32, the auxiliary connection trace 30-1CA of the laminate 28, and the secondary BW 50. For some applications, one or more metal layers 30 other than the first metal layer 30-1 (e.g., the second, third, fourth, and/or fifth metal layers 30-2, 30-3, 30-4, and/or 30-5) may also include one or more auxiliary connection traces (not shown). The BW 32 and the secondary BW 50 might be connected by such one or more auxiliary connection traces inside the laminate 28 instead of or in addition to the auxiliary connection trace 30-1CA of the first metal layer 30-1 (not shown). The inductor 26, which connects the acoustic die 12/one resonator 14 to ground (e.g., one shunt inductor 16 shown in FIGS. 1A-1E), is composed of the connection trace 30-1C, the BW 32, the secondary BW 50, the one or more auxiliary connection traces used to connect the BW 32 and the secondary BW 50, and the optional ground connection trace 30-1CG.

For some applications, the first metal layer 30-1 may include two or more auxiliary connection traces 30-1CA, and the acoustic filter 10 may include two or more secondary BWs 50 to connect the auxiliary connection traces 30-1CA and the ground connection trace 30-1CG/the ground portion 30-1G of the first metal layer 30-1. In consequence, the inductor 26, which connects the acoustic die 12/one resonator 14 to ground (e.g., one shunt inductor 16 shown in FIGS. 1A-1E), is composed of the BW 32, the connection trace 30-1C, the two or more auxiliary connection traces 30-1CA, the two or more secondary BWs 50, and the optional ground connection trace 30-1CG. In addition, the BW 32 and the secondary BWs 50 might be connected by different auxiliary connection traces within the laminate 28. For a non-limiting example, the BW 32 is connected to one of the secondary BWs 50 by one auxiliary connection trace 30-1CA of the first metal layer 30-1, while connections between the secondary BWs 50 are implemented by auxiliary connection traces in the second metal layer 30-2 with metal vias (similar to the metal vias 40 shown in FIG. 4).

In some applications, each of the BW 32 and the secondary BW 50 has a Pi-shaped structure. The BW 32 consists of the first vertical section 32V-1, the second vertical section 32V-2, and the horizontal section 32H connecting the first and second vertical sections 32V-1 and 32V-2. The secondary BW 50 consists of a first vertical section 50V-1, a second vertical section 50V-2, and a horizontal section 50H connecting the first and second vertical sections 50V-1 and 50V-2. In different applications, fewer or more sections can be included in each of the BW 32 and the secondary BW 50. Also, other geometry structures can be used for the BW 32 and the secondary BW 50, for example an inverted U-shaped structure, an inverted V-shaped structure, and any combination of the Pi-shaped structure, the inverted U-shaped structure, and/or the inverted V-shaped structure (e.g., the BW 32 has the inverted U-shaped structure while the secondary BW 50 has a Pi-shaped structure). Furthermore, each of the BW 32 and the secondary BW 50 may be replaced by two BW vertical sections and one isolated shielding strip (e.g., a combination of the first vertical sections 32V-1, the isolated shielding strip 46, and the second vertical section 32V-2 shown in FIGS. 5A and 5B).

In some applications, one or more surface mounted devices (SMDs), such as SMD inductors, may also be introduced to further enhance the inductance of the acoustic filter 10, as illustrated in FIG. 8. For the purpose of this illustration, the acoustic filter 10 includes an SMD inductor 52 formed over the laminate 28. Herein, the acoustic die 12/one resonator 14 is electrically coupled to the connection trace 30-1C of the laminate 28 through the corresponding die bump 36. The connection trace 30-1C connects the corresponding die bump 36 to the BW 32, one auxiliary connection trace 30-1CA connects the BW 32 to a first side of the SMD inductor 52, and a second auxiliary connection trace 30-1CA connects a second side of the SMD inductor 52 to the secondary BW 50. The secondary BW 50 may be coupled to the ground portion 30-1G directly or through the ground connection trace 30-1CG. As such, the inductor 26, which connects the acoustic die 12/one resonator 14 to ground (e.g., one shunt inductor 16 shown in FIGS. 1A-1E), is composed of the connection trace 30-1C of the laminate 28, the BW 32, two auxiliary connection traces 30-1CA of the laminate 28, the SMD inductor 52, the secondary BW 50, and the optional ground connection trace 30-1CG of the laminate 28.

To implement other inductors that are not coupled to ground (e.g., the first parallel inductor 18, the series inductor 22, or the connection inductor 24), the combination of the connection trace 30-1C, the BW 32, the auxiliary connection traces 30-1CA, the SMD inductor 52, and the secondary BW 50 does not connect the acoustic die 12/resonator 14 to ground, but connects the acoustic die 12/resonator 14 to a non-grounded trace of the laminate 28 (not shown). In this illustration, the SMD inductor 52 is coupled between the BW 32 and the secondary BW 50. In different applications, the SMD inductor 52 may be coupled between the acoustic die 12/one resonator 14 and the BW 32, between the BW 32 and ground/one non-grounded trace (if the secondary BW 50 is omitted), between the secondary BW 50 and ground/one non-grounded trace, or between two secondary BWs 50 (if more than one secondary BW 50 exist). Similar to that described above, connections between the BW 32 and the SMD inductor 52, between the SMD inductor 52 and the secondary BW 50, and/or between the SMD inductor 52 and ground/one non-grounded trace can be implemented by auxiliary connection traces in one or more metal layers 30 of the laminate 28. In addition, the SMD inductor 52 may be replaced by another type of SMD, which may utilize its internal metal elements to provide extra inductance to the acoustic filter 10.

More complex configurations are possible for implementing the inductor 26 in the acoustic filter 10, which consist of one or more BWs (e.g., the BW 32 and/or 50 shown in FIGS. 2A-2C and 4-8), one or more connection traces (e.g., the connection traces 30-1C, 30-2C, and/or 30-1CA shown in FIGS. 2A-2C and 4-7), one or more SMD inductors (e.g., the SMD inductor 52 formed over the laminate 28), and/or one or more isolated shielding strips (e.g., the isolated shielding strip 46 shown in FIGS. 5A-5B) formed from the same metal layers as the shielding structure (e.g., the shielding structure 44).

Figure 9:
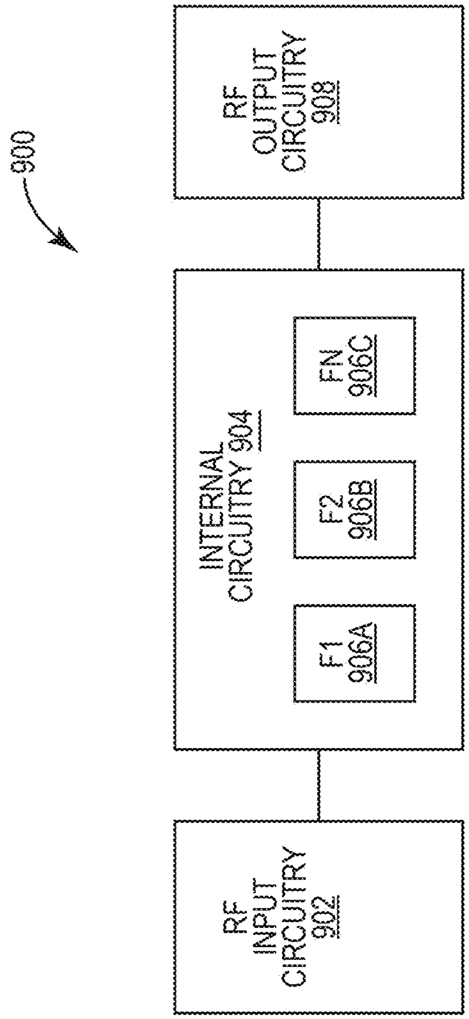
FIG. 9 illustrates a block diagram of an example system that includes at least one acoustic filter with laminate-based and bond-wire based inductance.

FIG. 9 illustrates a block diagram of an example system 900 that includes at least one acoustic filter. The system 900 includes RF input circuitry 902 connected to internal circuitry 904 (e.g., filter circuitry or multiplexer circuitry). In certain embodiments, the RF input circuitry 902 includes a transceiver. For the purpose of this illustration, the internal circuitry 904 includes three filters 906A, 906B, and 906C. Herein, at least one of the filters 906A, 906B, and 906C may be the acoustic filter 10 implemented as shown in FIGS. 2A-2C and 4-8. In different applications, the internal circuitry 904 may include more or fewer filters. In one embodiment, the internal circuitry 904 is filter circuitry and the filters 906A, 906B, and 906C may be connected in a cascaded arrangement. In one embodiment, the internal circuitry 904 is multiplexer circuitry, and the filters 906A, 906B, and 906C form a triplexer. The filter types that are included in the internal circuitry 904 may be based at least on the rejection requirements of the system 900 (e.g., each of the filters 906A, 906B, and 906C may be a lowpass filter or a bandpass filter). The internal circuitry 904 is connected to an RF output circuitry 908. In certain embodiments, the RF output circuitry 908 includes an antenna. The RF input circuitry 902 and/or the RF output circuitry 908 may include additional or different components in other embodiments.

Figure 10:
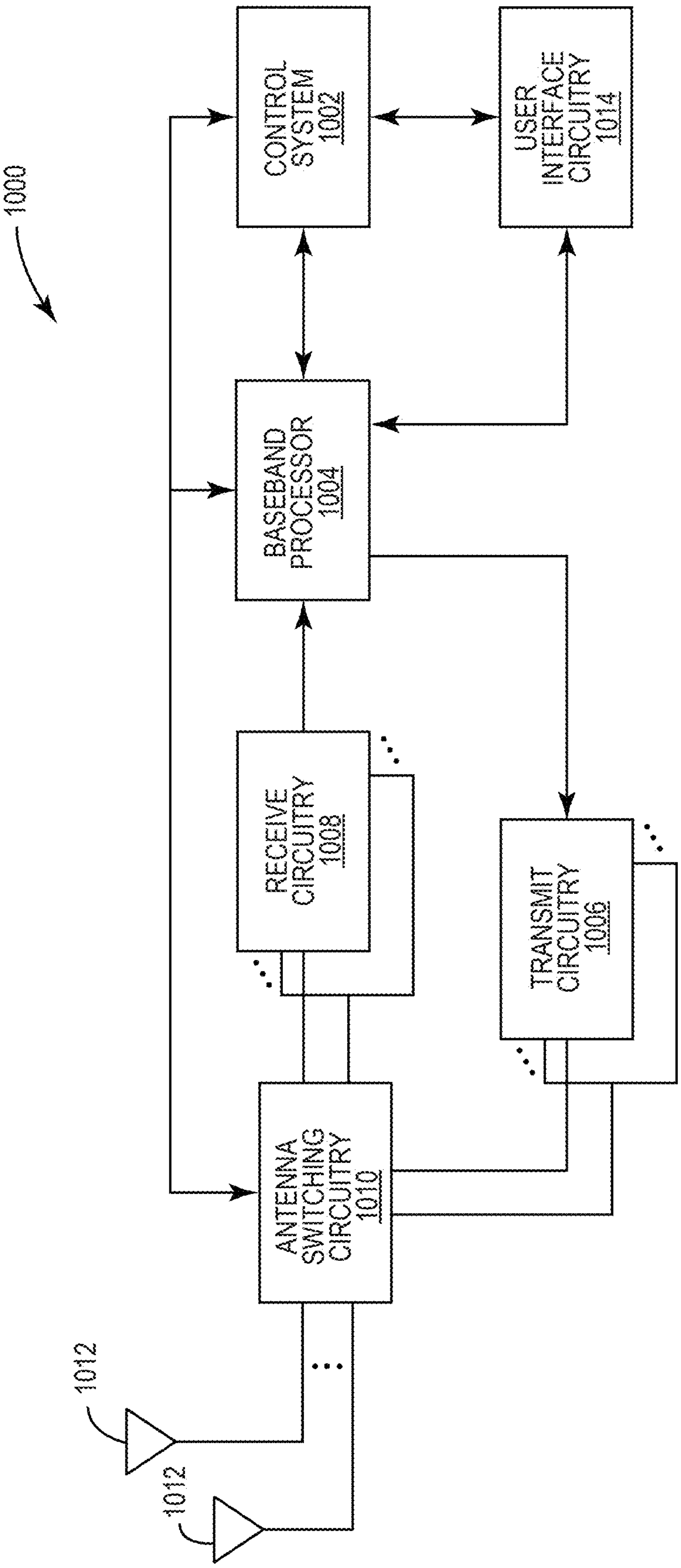
FIG. 10 illustrates a block diagram of example user elements that include at least one acoustic filter with laminate-based and bond-wire based inductance.

FIG. 10 illustrates a block diagram of example user elements that include at least one acoustic filter 10 implemented as shown in FIGS. 2A-2C and 4-8. The concepts described above may be implemented in various types of user elements 1000, such as mobile terminals, smart watches, tablets, computers, navigation devices, access points, and like wireless communication devices that support wireless communications, such as cellular, wireless local area network (WLAN), BLUETOOTH, and near field communications. The user elements 1000 will generally include a control system 1002, a baseband processor 1004, transmit circuitry 1006, receive circuitry 1008, antenna switching circuitry 1010, multiple antennas 1012, and user interface circuitry 1014. In a non-limiting example, the control system 1002 can be a field-programmable gate array (FPGA) or an application-specific integrated circuit (ASIC), as an example. In this regard, the control system 1002 can include at least a microprocessor(s), an embedded memory circuit(s), and a communication bus interface(s). The receive circuitry 1008 receives radio frequency signals via the antennas 1012 and through the antenna switching circuitry 1010 from one or more base stations. A low noise amplifier and a filter or a bank of filters (e.g., the acoustic filter 10, or a multiplexer/switchplexer with multiple acoustic filters 10) of the receive circuitry 1008 cooperate to amplify and remove broadband interference from the received signal for processing. Down conversion and digitization circuitry (not shown) will then down convert the filtered, received signal to an intermediate or baseband frequency signal, which is then digitized into one or more digital streams using analog-to-digital converter(s) (ADC).

The baseband processor 1004 processes the digitized received signal to extract the information or data bits conveyed in the received signal. This processing typically comprises demodulation, decoding, and error correction operations, as will be discussed in greater detail below. The baseband processor 1004 is generally implemented in one or more digital signal processors (DSPs) and ASICs.

For transmission, the baseband processor 1004 receives digitized data, which may represent voice, data, or control information, from the control system 1002, which it encodes for transmission. The encoded data is output to the transmit circuitry 1006, where a digital-to-analog converter(s) (DAC) converts the digitally encoded data into an analog signal and a modulator modulates the analog signal onto a carrier signal that is at a desired transmit frequency or frequencies. In some applications, the transmit circuitry 1006 may also include a filter or a bank of filters (e.g., the acoustic filter 10, or a multiplexer/switchplexer with multiple acoustic filters 10). A power amplifier will amplify the modulated carrier signal to a level appropriate for transmission and deliver the modulated carrier signal to the antennas 1012 through the antenna switching circuitry 1010. The multiple antennas 1012 and the replicated transmit and receive circuitries 1006, 1008 may provide spatial diversity. Modulation and processing details will be understood by those skilled in the art. Herein, at least one of the baseband processor 1004, the transmit circuitry 1006, and the receive circuitry 1008 includes one or more acoustic filter 10 described above.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An acoustic filter, comprising:

a laminate with a first metal layer, which is formed on a top surface of the laminate and includes at least a connection trace;

an acoustic device die mounted on the top surface of the laminate through a plurality of die bumps and including a plurality of resonators, wherein the plurality of resonators comprises at least a first resonator, and a first electrode of the first resonator is electrically coupled to a first end of the connection trace through one of the plurality of die bumps; and a bond-wire (BW) formed over the top surface of the laminate and in contact with a second end of the connection trace, wherein:

the BW is not in contact with the acoustic device die; and at least the BW and the connection trace form an inductor electrically connected to the first resonator in the acoustic device die.

2. The acoustic filter of claim 1 wherein:

the first metal layer further includes an extra connection trace, which is separate from the connection trace;

the BW includes a first vertical section, a second vertical section, and a horizontal section;

a bottom end of the first vertical section is in contact with the second end of the connection trace, a bottom end of the second vertical section is directly attached to the extra connection trace, and a top end of the first vertical section and a top end of the second vertical section are connected by the horizontal section; and the inductor electrically connected to the first resonator is formed at least by a combination of the BW, the connection trace, and the extra connection trace.

3. The acoustic filter of claim 2 further comprising a mold compound and a shielding structure, wherein:

the mold compound resides over the top surface of the laminate and fully encapsulates the acoustic device die and the BW; and the shielding structure covers at least a top surface of the mold compound and is coupled to ground.

4. The acoustic filter of claim 2 wherein the extra connection trace is electrically connected to ground, an input port, a second electrode of the first resonator, or a second resonator included in the plurality of resonators.

5. The acoustic filter of claim 1 further comprising a mold compound, a shielding structure, and an isolated shielding strip, wherein:

the mold compound resides over the top surface of the laminate and fully encapsulates the acoustic device die;

the shielding structure is formed at least over a top surface of the mold compound and is coupled to ground;

the isolated shielding strip is formed over the top surface of the mold compound and is separate from the shielding structure by a gap, wherein the shielding structure and the isolated shielding strip are formed from a same set of metal layers; and the BW includes a first vertical section and a second vertical section, which extend vertically through the mold compound and are connected to two ends of the isolated shielding strip, respectively, wherein at least the BW, the isolated shielding strip, and the connection trace form the inductor that is electrically connected to the first resonator in the acoustic device die.

6. The acoustic filter of claim 5, wherein:

the first metal layer further includes an extra connection trace, which is separate from the connection trace;

a bottom end of the first vertical section is in contact with the second end of the connection trace, a bottom end of the second vertical section is directly attached to the extra connection trace, and a top end of the first vertical section and a top end of the second vertical section are connected by the isolated shielding strip; and a combination of the BW and the isolated shielding strip is configured to connect the connection trace to the extra connection trace, and the inductor electrically connected to the first resonator is formed at least by a combination of the connection trace, the BW, the isolated shielding strip, and the extra connection trace.

7. The acoustic filter of claim 6 wherein the extra connection trace is electrically connected to ground, an input port, a second electrode of the first resonator, or a second resonator included in the plurality of resonators.

8. The acoustic filter of claim 1 wherein:

the laminate further includes a second metal layer different from the first metal layer, wherein the second metal layer at least includes a second connection trace;

the first electrode of the first resonator is electrically coupled to the connection trace of the first metal layer through the second connection trace of the second metal layer; and the inductor electrically connected to the first resonator in the acoustic device die is formed at least by a combination of the BW, the connection trace, and the second connection trace in the laminate.

9. The acoustic filter of claim 1 further comprising a mold compound, and a shielding structure, wherein:

the mold compound resides over the top surface of the laminate and fully encapsulates the acoustic device die;

the shielding structure covers at least a top surface of the mold compound and is coupled to ground; and the BW is a vertical element, which extends vertically through the mold compound and is in contact with the shielding structure.

10. The acoustic filter of claim 1 further comprising a secondary BW formed over the top surface of the laminate, wherein:

the laminate comprises a plurality of metal layers, wherein the first metal layer is included in the plurality of metal layers;

at least one of the plurality of metal layers includes an auxiliary connection trace, which is separate from the connection trace of the first metal layer;

the BW is configured to connect the second end of the connection trace to a first end of the auxiliary connection trace; and the secondary BW is connected to a second end of the auxiliary connection trace and in series with the first BW, such that the inductor electrically connected to the first resonator is formed at least by a combination of the connection trace, the BW, the auxiliary connection trace, and the secondary BW.

11. The acoustic filter of claim 10, wherein:

the first metal layer further includes an extra connection trace, which is separate from the connection trace and the auxiliary connection trace; and the secondary BW is configured to connect the auxiliary connection trace to the extra connection trace, such that the inductor electrically connected to the first resonator is formed at least by a combination of the connection trace, the BW, the auxiliary connection trace, the secondary BW, and the extra connection trace.

12. The acoustic filter of claim 11 wherein the extra connection trace is electrically connected to ground, an input port, a second electrode of the first resonator, or a second resonator included in the plurality of resonators.

13. The acoustic filter of claim 1 further comprising a surface mounted device (SMD) inductor formed over the top surface of the laminate, wherein:

the laminate comprises a plurality of metal layers, wherein the first metal layer is included in the plurality of metal layers;

at least one of the plurality of metal layers includes an auxiliary connection trace, which is separate from the connection trace of the first metal layer;

the BW is configured to connect the second end of the connection trace to a first end of the auxiliary connection trace; and the SMD inductor is connected to a second end of the auxiliary connection trace and in series with the first BW, such that the inductor electrically connected to the first resonator is formed at least by a combination of the connection trace, the BW, the auxiliary connection trace, and the SMD inductor.

14. The acoustic filter of claim 13 further comprising a mold compound, a shielding structure, and an isolated shielding strip, wherein:

the mold compound resides over the top surface of the laminate and fully encapsulates the acoustic device die and the SMD inductor;

the shielding structure is formed at least over a top surface of the mold compound and is coupled to ground;

the isolated shielding strip is formed over the top surface of the mold compound and is separated from the shielding structure by a gap, wherein the shielding structure and the isolated shielding strip are formed from a same set of metal layers; and the BW includes a first vertical section and a second vertical section, which extend vertically through the mold compound and are connected to two ends of the isolated shielding strip, respectively, wherein at least the connection trace of the first metal layer, the BW, the isolated shielding strip, the auxiliary connection trace, and the SMD inductor form the inductor that is electrically connected to the first resonator in the acoustic device die.

15. The acoustic filter of claim 1 wherein the BW has one of a group consisting of a Pi-shaped structure, an inverted U-shaped structure, and an inverted V-Shaped structure.

16. The acoustic filter of claim 1, wherein:

the first metal layer further includes a ground portion, which is separate from the connection trace and is coupled to ground; and the BW is in contact with the ground portion and configured to connect the second end of the connection trace to the ground portion, such that the first resonator is coupled to ground through the inductor at least formed by the combination of the BW and the connection trace in the laminate.

17. The acoustic filter of claim 1, wherein:

the first metal layer further includes an extra connection trace, which is separate from the connection trace and electrically coupled to a second electrode of the first resonator; and the BW is connected directly and in series between the connection trace and the extra connection trace, such that the particular resonator is parallel to the inductor formed by a combination of the BW, the connection trace, and the extra connection trace.

18. The acoustic filter of claim 1, wherein:

the first metal layer further includes an extra connection trace, which is separate from the connection trace and is coupled to an input port; and the BW is in contact with the extra connection trace and configured to connect the second end of the connection trace to the extra connection trace, such that the first resonator is coupled to the input port through the inductor formed by a combination of the BW, the connection trace, and the extra connection trace.

19. The acoustic filter of claim 1, wherein:

the plurality of resonators further includes a second resonator;

the first metal layer further includes an extra connection trace, which is separate from the connection trace;

the second resonator is electrically coupled to a first end of the extra connection trace; and the BW is connected directly and in series between a second end of the extra connection trace and the second end of the connection trace, such that the inductor, which is formed by a combination of the BW, the connection trace, and the extra connection trace, is electrically coupled between the first resonator and the second resonator.

20. A system comprising:

radio-frequency (RF) input circuitry;

RF output circuitry; and filter circuitry, which includes at least one acoustic filter, connected between the RF input circuitry and the RF output circuitry, wherein the at least one acoustic filter comprises:

a laminate with a first metal layer, which is formed on a top surface of the laminate and includes at least a connection trace;

an acoustic device die mounted on the top surface of the laminate through a plurality of die bumps and including a plurality of resonators, wherein the plurality of resonators comprises at least a first resonator, and a first electrode of the first resonator is electrically coupled to a first end of the connection trace through one of the plurality of die bumps; and a bond-wire (BW) formed over the top surface of the laminate and in contact with a second end of the connection trace, wherein:

the BW is not in contact with the acoustic device die; and at least the BW and the connection trace form an inductor electrically connected to the first resonator in the acoustic device die.

21. A user element comprising:

a baseband processor;

receive circuitry; and transmit circuitry, wherein at least one of the baseband processor, the transmit circuitry, and the receive circuitry includes an acoustic filter, which comprises:

a laminate with a first metal layer, which is formed on a top surface of the laminate and includes at least a connection trace;

an acoustic device die mounted on the top surface of the laminate through a plurality of die bumps and including a plurality of resonators, wherein the plurality of resonators comprises at least a first resonator, and a first electrode of the first resonator is electrically coupled to a first end of the connection trace through one of the plurality of die bumps; and a bond-wire (BW) formed over the top surface of the laminate and in contact with a second end of the connection trace, wherein:

the BW is not in contact with the acoustic device die; and at least the BW and the connection trace form an inductor electrically connected to the first resonator in the acoustic device die.

* * * * *